United States Patent
Ren et al.

(10) Patent No.: US 10,395,886 B2
(45) Date of Patent: Aug. 27, 2019

(54) APPARATUS OF PLURAL CHARGED-PARTICLE BEAMS

(71) Applicant: ASML Netherlands B.V., DR Veldhoven (NL)

(72) Inventors: Weiming Ren, San Jose, CA (US);
Xuedong Liu, San Jose, CA (US);
Xuerang Hu, San Jose, CA (US);
Zhongwei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/216,258

(22) Filed: Jul. 21, 2016

(65) Prior Publication Data
US 2017/0025243 A1    Jan. 26, 2017

Related U.S. Application Data

(60) Provisional application No. 62/195,353, filed on Jul. 22, 2015.

(51) Int. Cl.
*H01J 37/14* (2006.01)
*H01J 37/147* (2006.01)
(Continued)

(52) U.S. Cl.
CPC .......... *H01J 37/1474* (2013.01); *H01J 37/06* (2013.01); *H01J 37/10* (2013.01); *H01J 37/1477* (2013.01);
(Continued)

(58) Field of Classification Search
CPC .. H01J 37/06; H01J 37/10; H01J 37/12; H01J 37/14; H01J 37/1474; H01J 37/1477;
(Continued)

(56) References Cited

U.S. PATENT DOCUMENTS 6,943,349 B2   9/2005  Adamec et al.
7,244,949 B2   7/2007  Knippelmeyer et al.
(Continued)

FOREIGN PATENT DOCUMENTS

EP      2 110 844 A1    10/2009
JP      2003-203857      7/2003
(Continued)

OTHER PUBLICATIONS

International Searching Authority USPTO "International Search Report and written opinion" dated Nov. 16, 2016, USA.
(Continued)

*Primary Examiner* — David E Smith
(74) *Attorney, Agent, or Firm* — Finnegan, Henderson, Farabow, Garrett & Dunner, LLP

(57) ABSTRACT

A multi-beam apparatus for observing a sample with high resolution and high throughput is proposed. In the apparatus, a source-conversion unit forms plural and parallel images of one single electron source by deflecting plural beamlets of a parallel primary-electron beam therefrom, and one objective lens focuses the plural deflected beamlets onto a sample surface and forms plural probe spots thereon. A movable condenser lens is used to collimate the primary-electron beam and vary the currents of the plural probe spots, a pre-beamlet-forming means weakens the Coulomb effect of the primary-electron beam, and the source-conversion unit minimizes the sizes of the plural probe spots by minimizing and compensating the off-axis aberrations of the objective lens and condenser lens.

44 Claims, 18 Drawing Sheets

(51) Int. Cl.
*H01J 37/06* (2006.01)
*H01J 37/10* (2006.01)
*H01J 37/28* (2006.01)

(52) U.S. Cl.
CPC .......... *H01J 37/1478* (2013.01); *H01J 37/28* (2013.01); *H01J 2237/024* (2013.01); *H01J 2237/0453* (2013.01); *H01J 2237/0492* (2013.01); *H01J 2237/103* (2013.01); *H01J 2237/1205* (2013.01); *H01J 2237/1516* (2013.01); *H01J 2237/1534* (2013.01); *H01J 2237/1536* (2013.01)

(58) Field of Classification Search
CPC .. H01J 37/1478; H01J 37/28; H01J 2237/024; H01J 2237/0453; H01J 2237/0492; H01J 2237/103; H01J 2237/1205; H01J 2237/1534; H01J 2237/1536
See application file for complete search history.

(56) References Cited

U.S. PATENT DOCUMENTS

| | | | |
|---|---|---|---|
| 7,880,143 B2 * | 2/2011 | Tanimoto | H01J 37/244 250/306 |
| 8,129,693 B2 * | 3/2012 | Preikszas | H01J 37/153 250/307 |
| 8,134,135 B2 | 3/2012 | Kruit et al. | |
| 8,294,095 B2 | 10/2012 | Chen et al. | |
| 8,362,425 B2 * | 1/2013 | Han | G01N 23/2251 250/306 |
| 9,082,577 B1 | 7/2015 | Fujita | |
| 2003/0001095 A1 | 1/2003 | Lo et al. | |
| 2003/0168606 A1 * | 9/2003 | Adamec | H01J 37/04 250/396 R |
| 2004/0232349 A1 * | 11/2004 | Kruit | B82Y 10/00 250/396 R |
| 2011/0192975 A1 * | 8/2011 | Chen | H01J 37/09 250/311 |
| 2012/0091358 A1 * | 4/2012 | Wieland | H01J 37/1471 250/396 R |
| 2012/0241606 A1 | 9/2012 | Han et al. | |
| 2013/0187046 A1 * | 7/2013 | Zeidler | B82Y 10/00 250/310 |

FOREIGN PATENT DOCUMENTS

| | | | |
|---|---|---|---|
| JP | 2005-175169 | 6/2005 | |
| JP | 2014-229481 | 12/2014 | |
| JP | 2014229481 A * | 12/2014 | H01J 37/12 |
| WO | WO 2016/145458 A1 | 9/2016 | |

OTHER PUBLICATIONS

Ren et al. "US Patent Application", U.S. Appl. No. 15/065,342, filed Mar. 9, 2016.
Ren et al. "US Patent Application", U.S. Appl. No. 15/078,369, filed Mar. 23, 2016.
Liu et al. "US Patent Application", U.S. Appl. No. 15/150,858, filed May 10, 2016.
Li et al. "US Patent Application", U.S. Appl. No. 15/213,781, filed Jul. 19, 2016.
Rodolfo Rosa, "The Merli-Missiroli-Pozzi Two-Slit Electron-Interference Experiment", Physics in Perspective, 14 (2012) 178-195, Bologna, Italy.
Singapore Written Opinion dated May 14, 2018, issued by the Singapore Patent Office in counterpart Singapore Patent Application No. 11201800270Q (5 pages).
Korean Office Action dated Dec. 19, 2018, Korean Patent Application No. 10-2018-7003901.
Notification of Reasons for Refusal dated Dec. 11, 2018, Japanese Patent Application No. 2018-503180.
European Supplementary Search Report dated Mar. 19, 2019, European Patent Application No. 16828551.

* cited by examiner

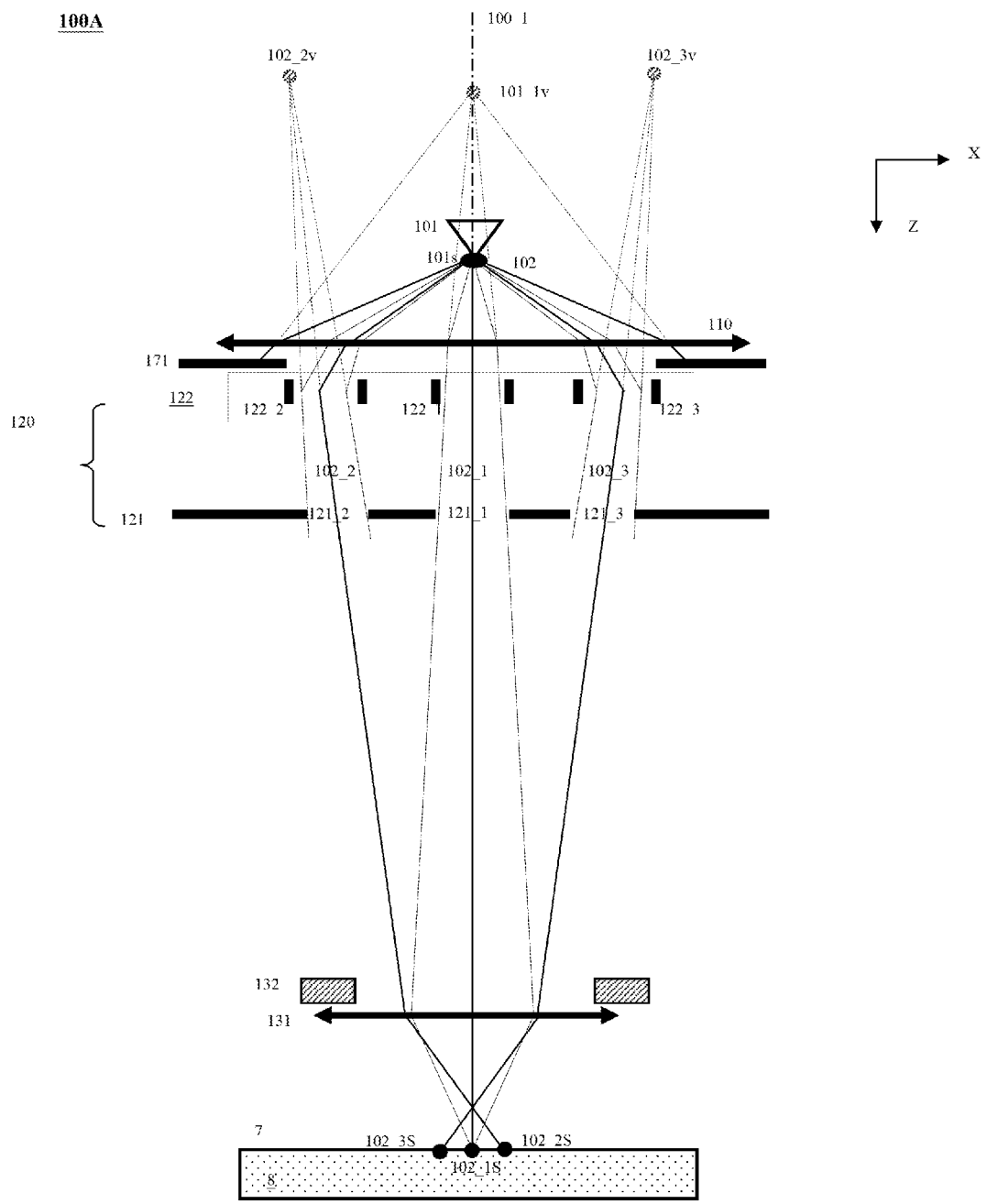
Figure 1 (Prior-Art)

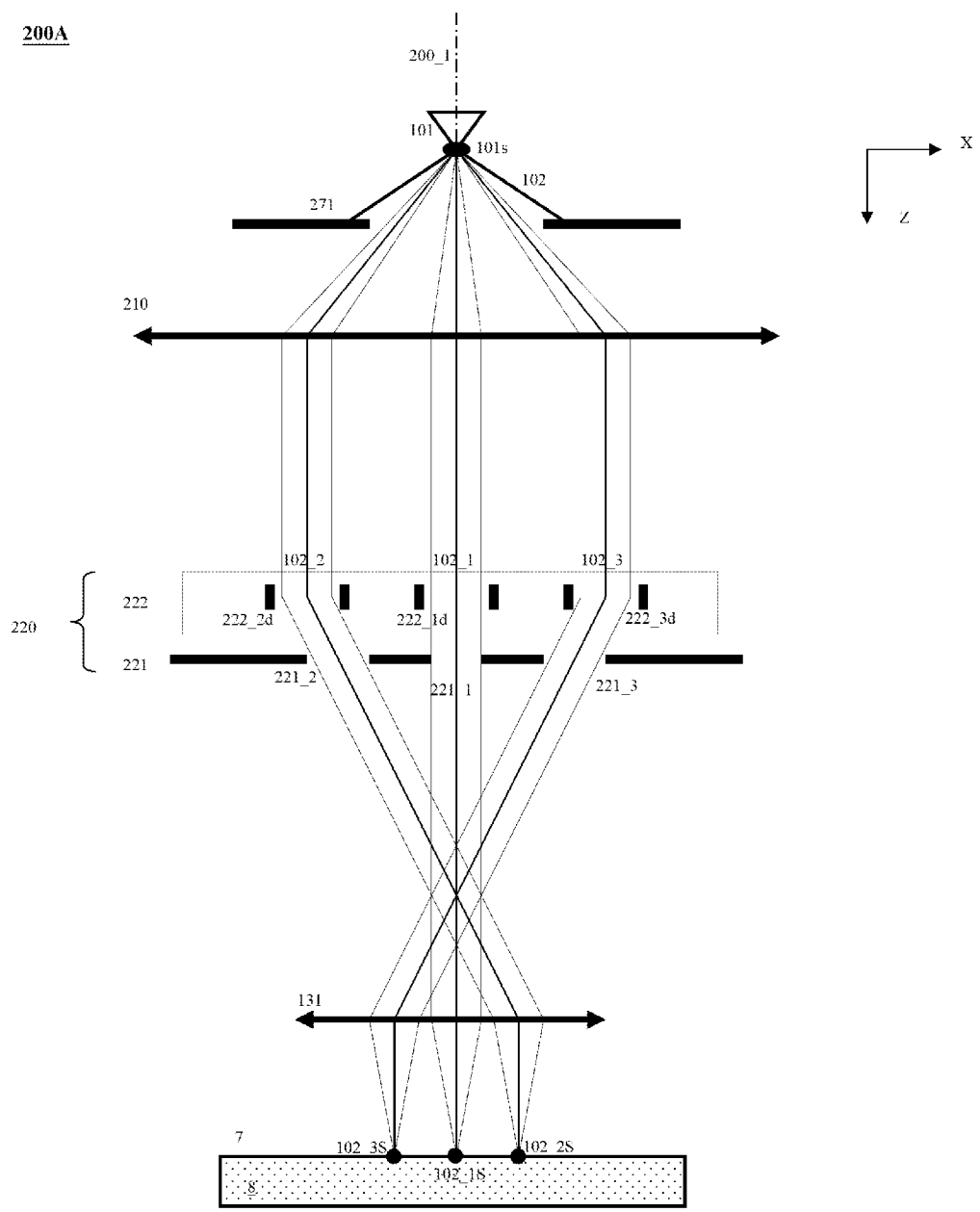
Figure 2 (Invention)

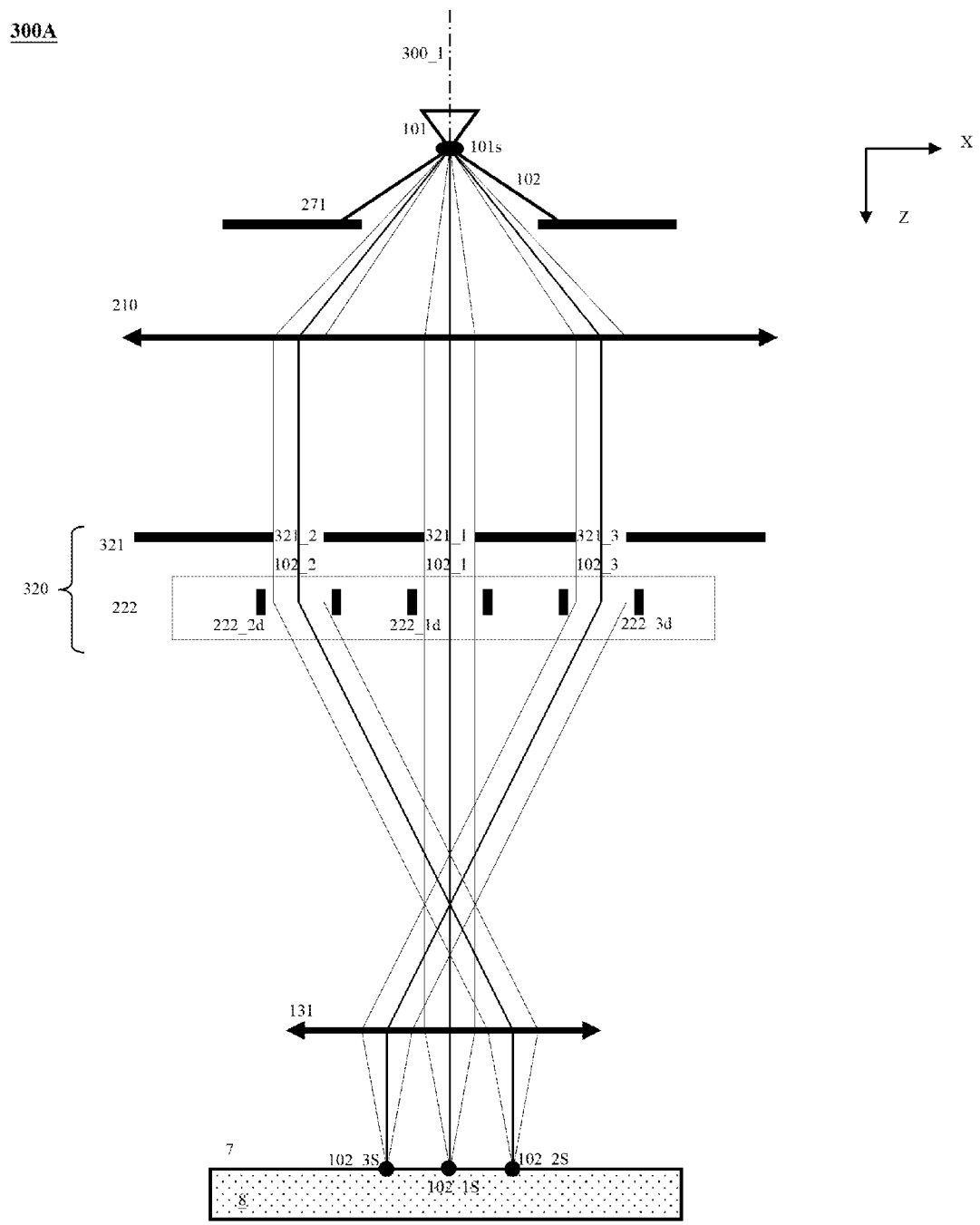
Figure 3 (Invention)

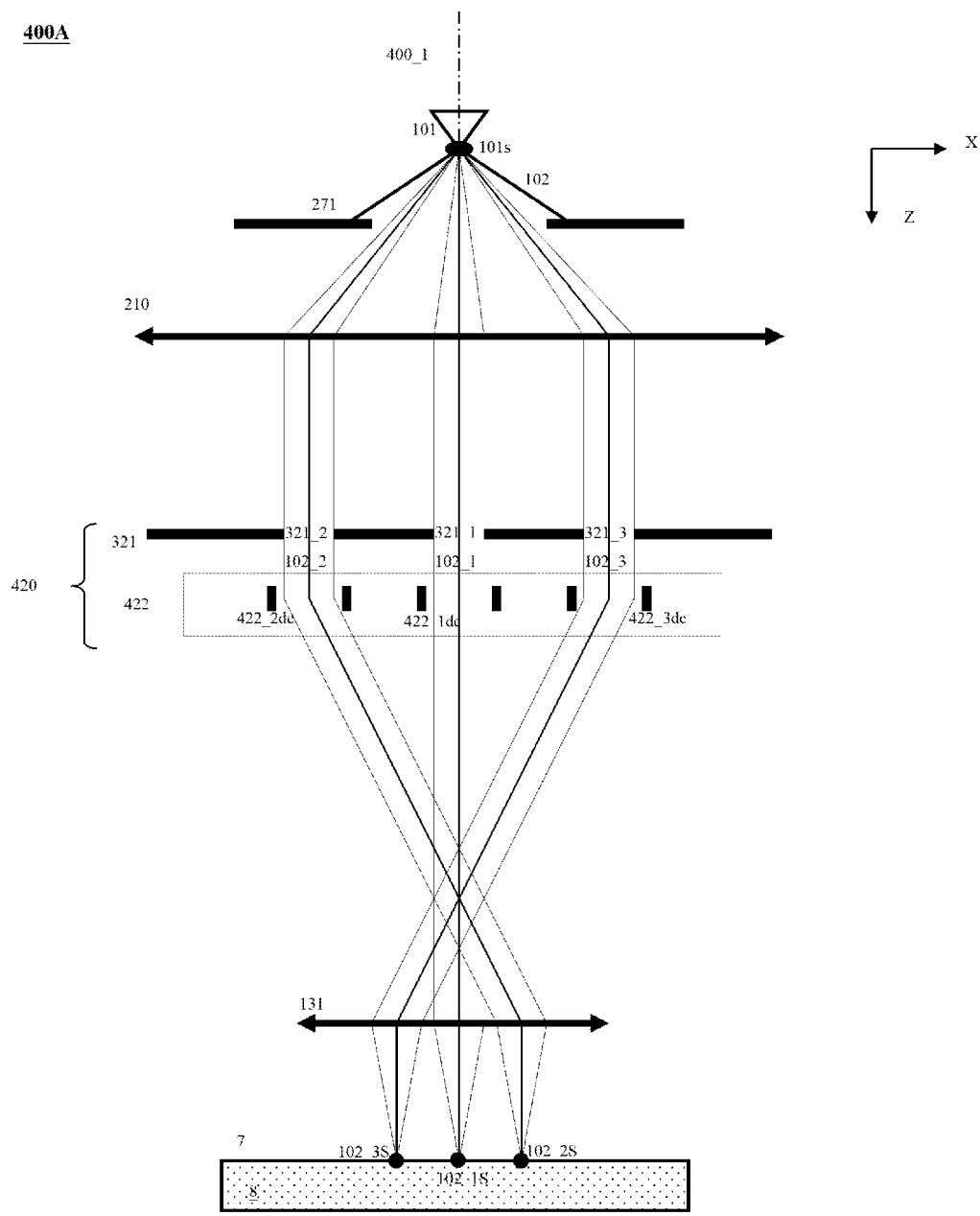
Figure 4 (Invention)

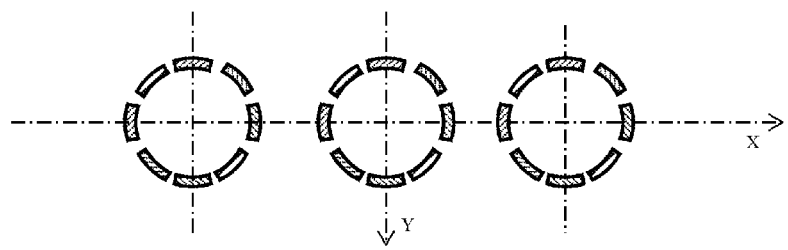
Figure 5 (Invention)
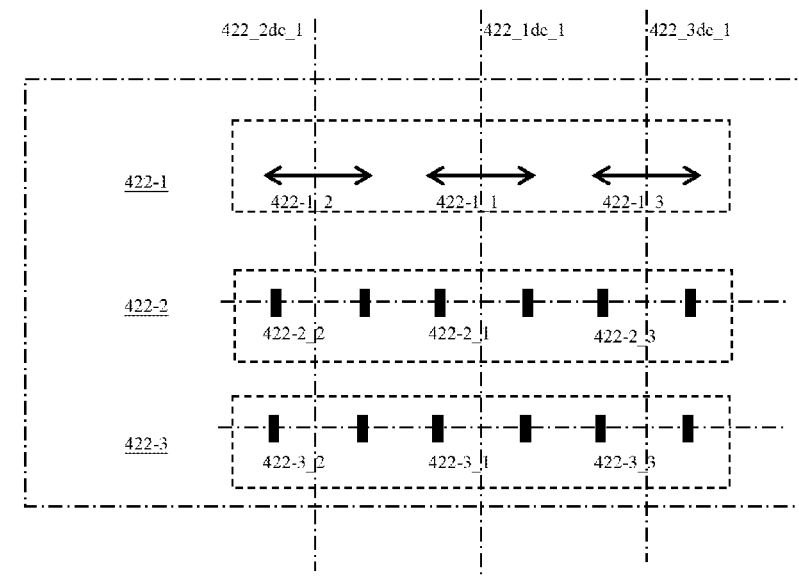
Figure 6A (Invention)

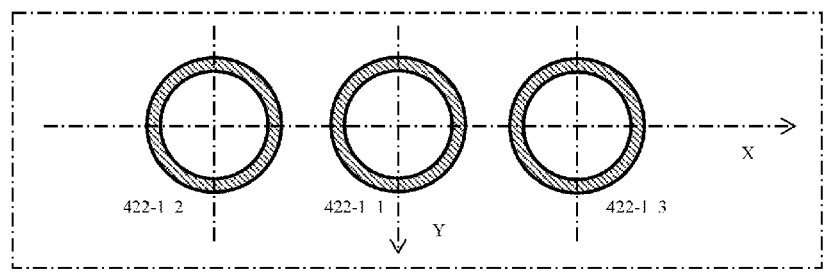
Figure 6B (Invention)
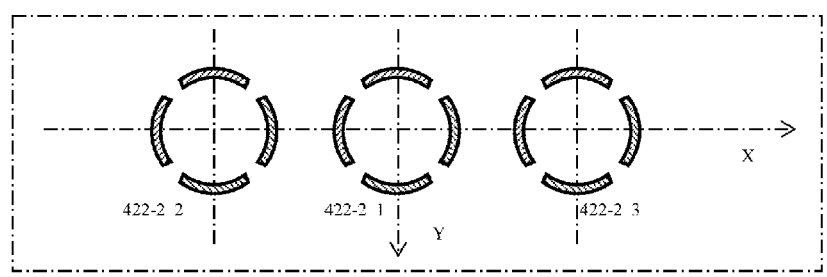
Figure 6C (Invention)
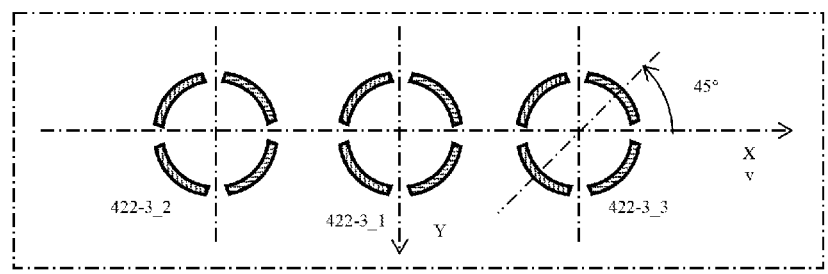
Figure 6D (Invention)

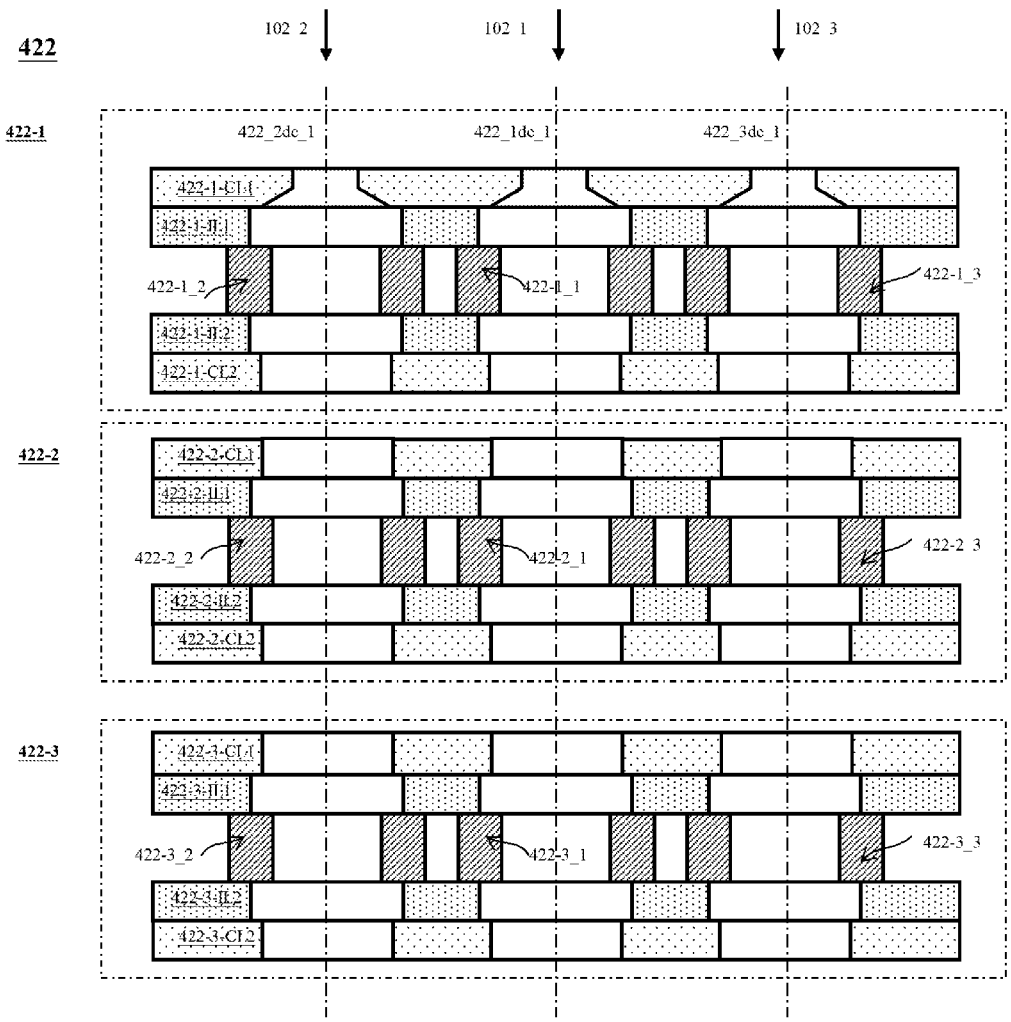
Figure 7A (Invention)

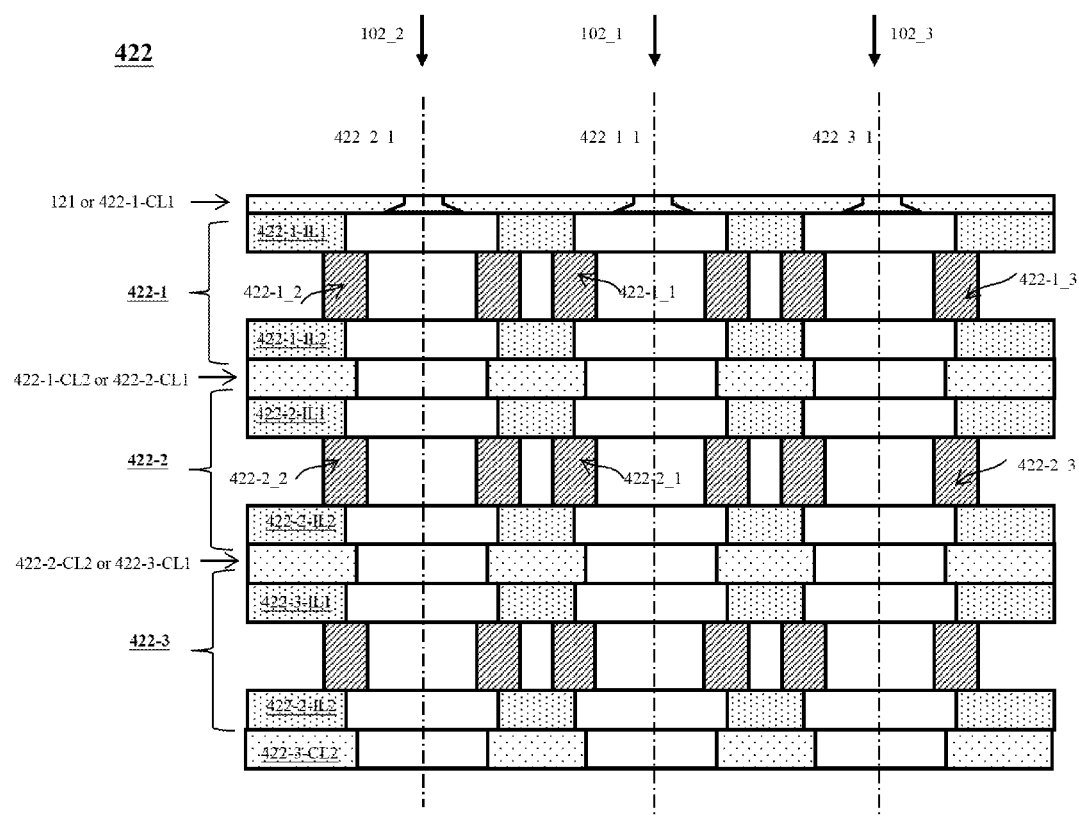
Figure 7B (Invention)

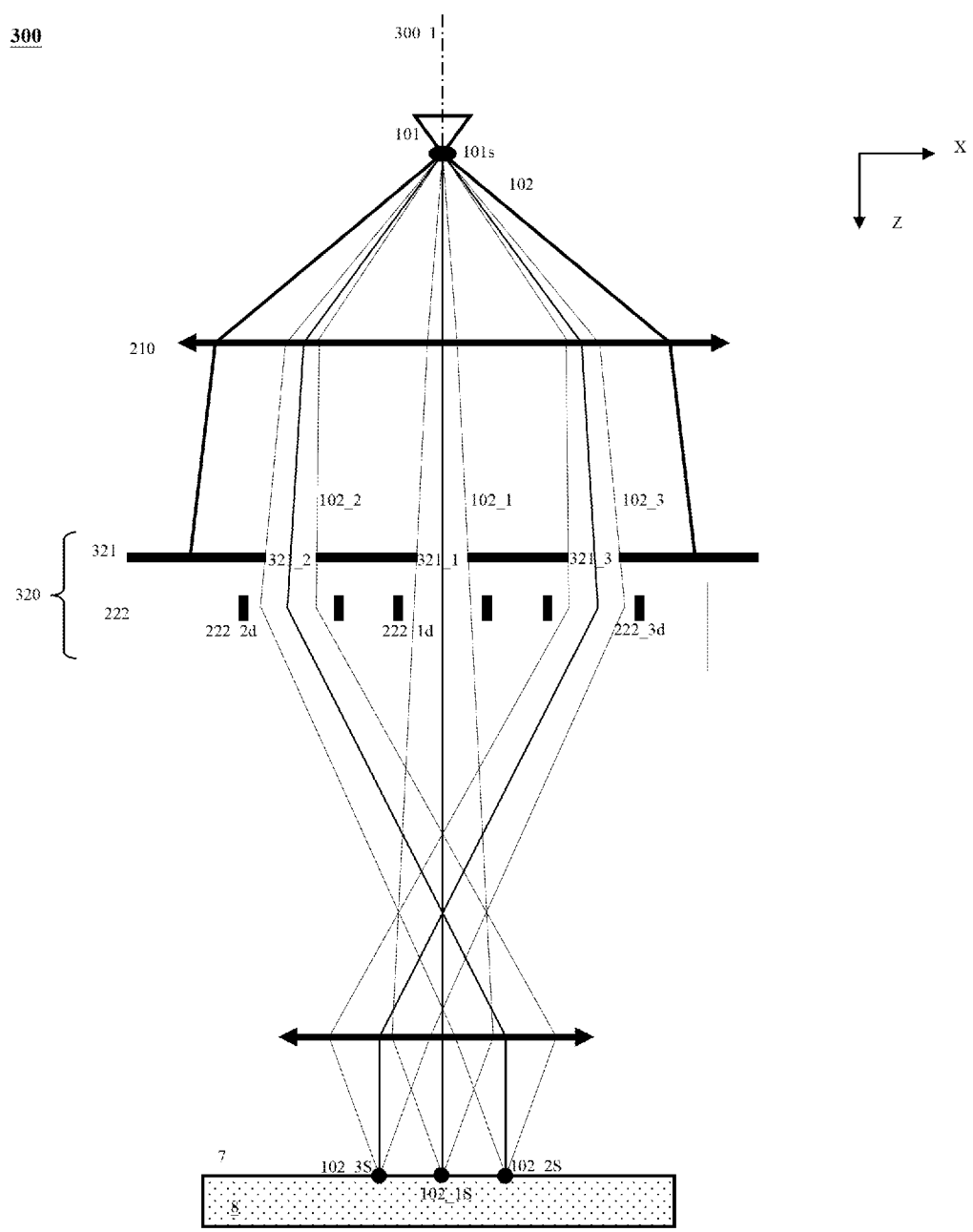
Figure 8 (Invention)

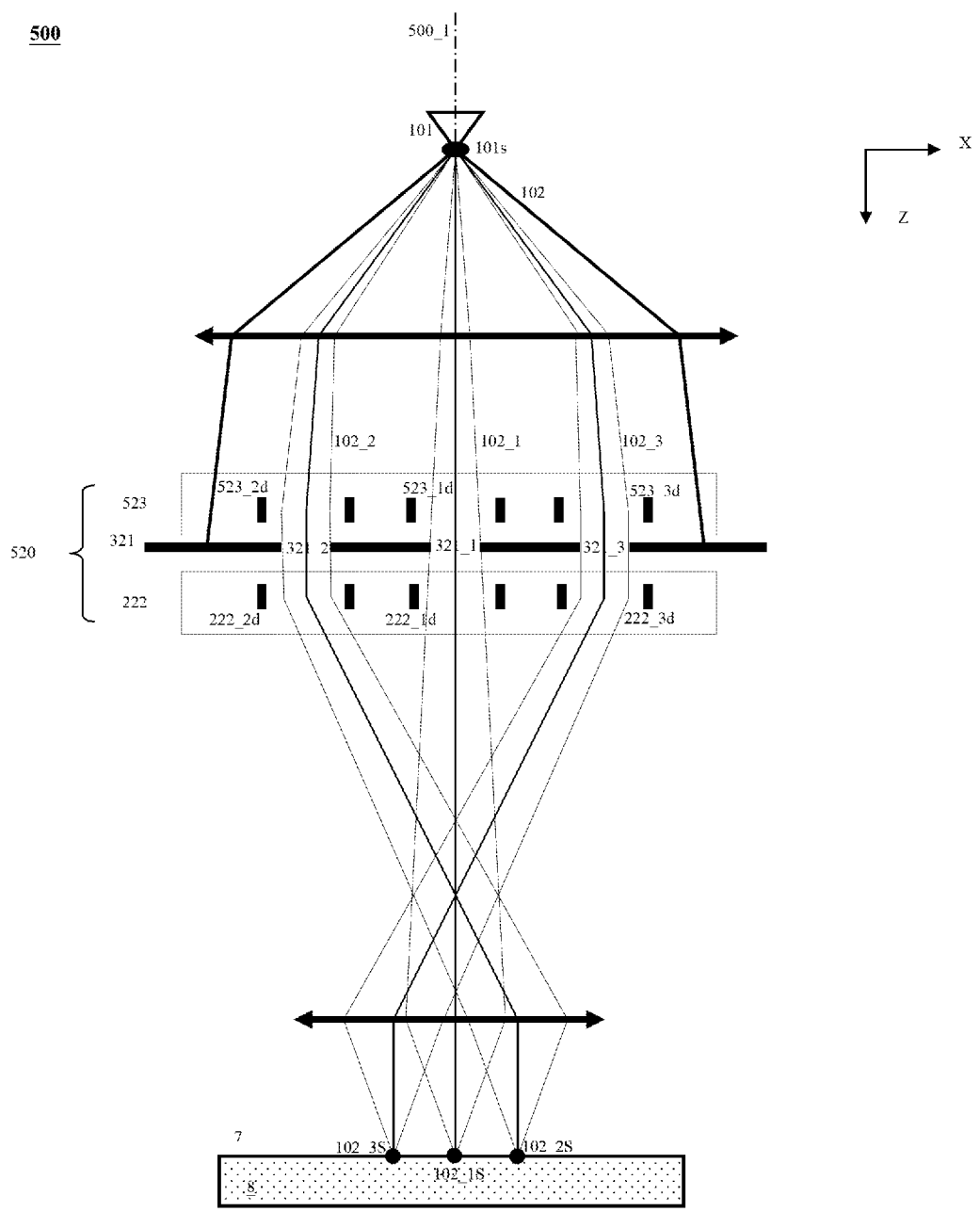
Figure 9 (Invention)

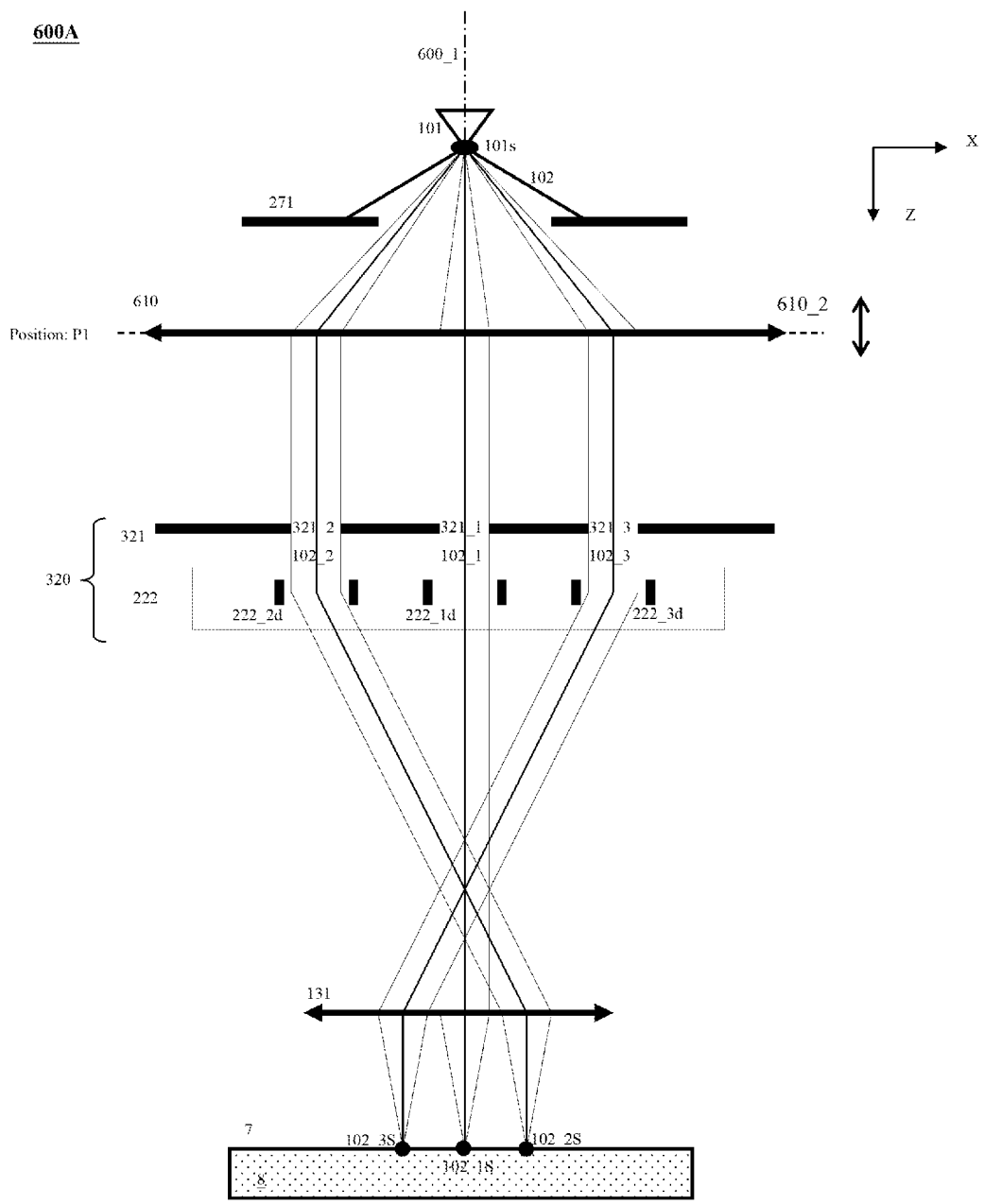
Figure 10 (Invention)

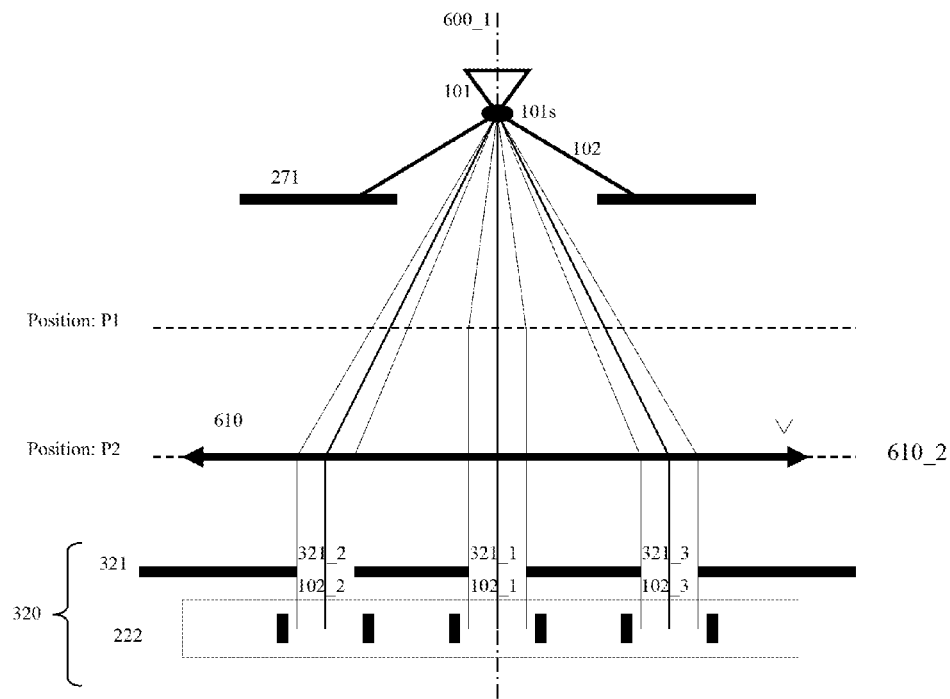
Figure 11A (Invention)
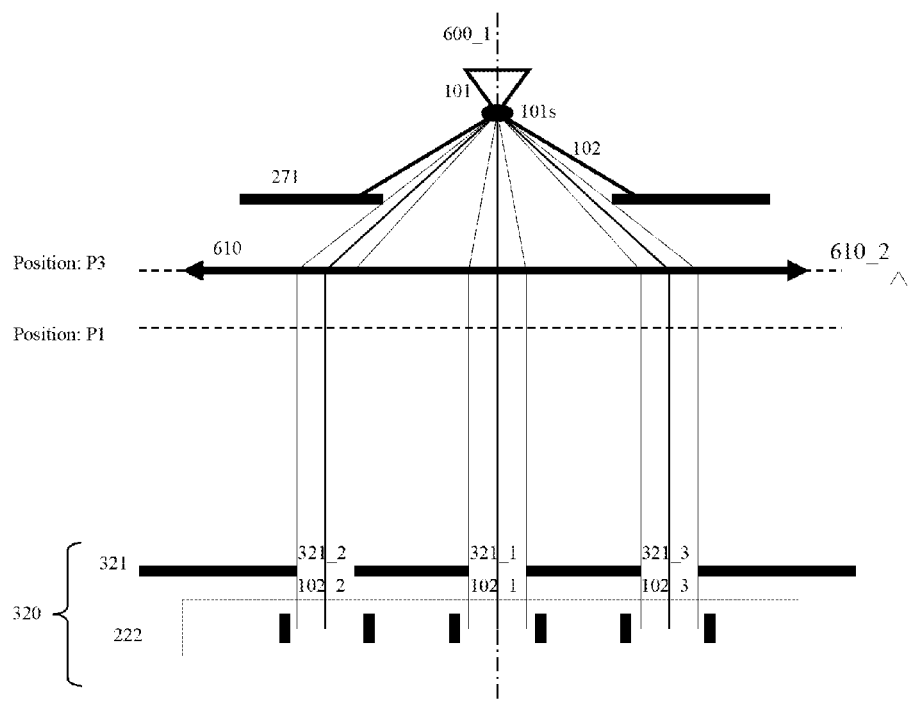
Figure 11B (Invention)

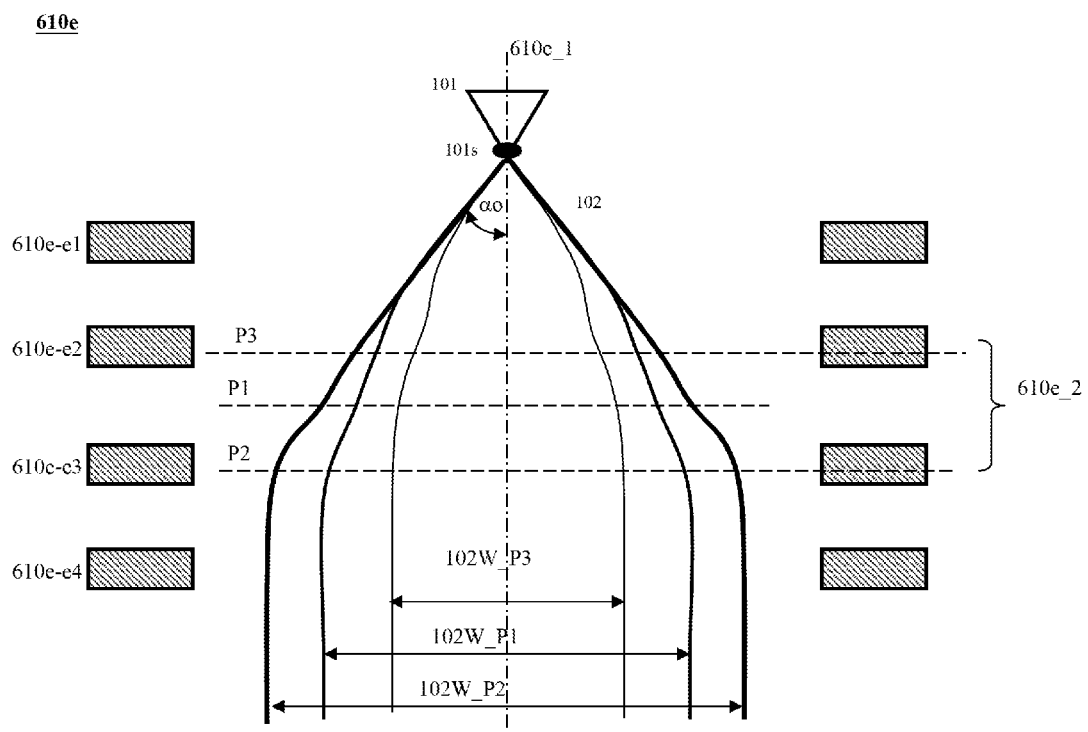
Figure 12 (Invention)

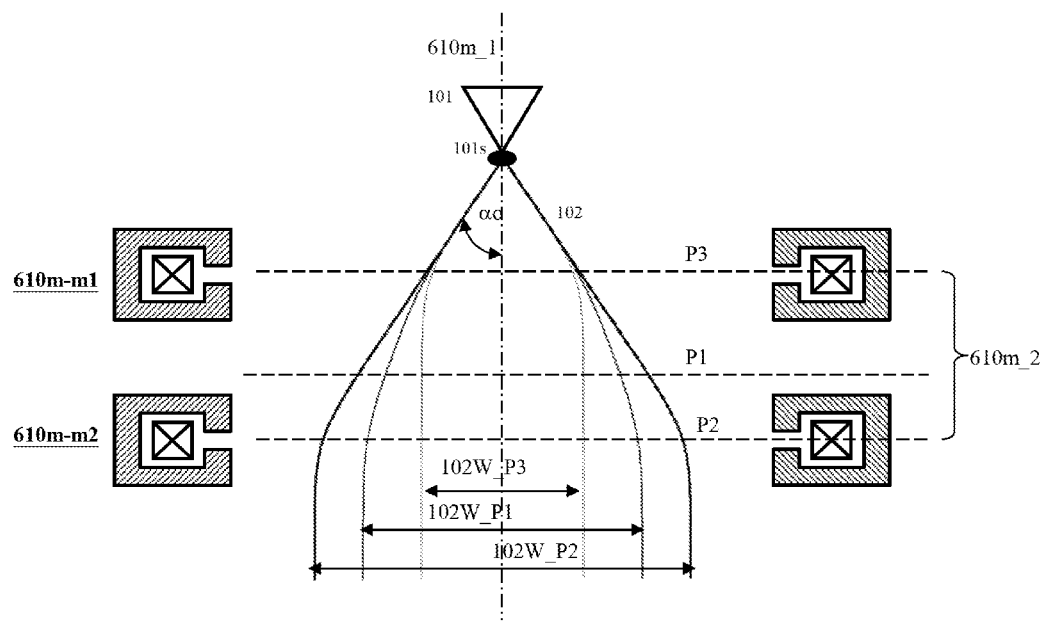
Figure 13A(Invention)
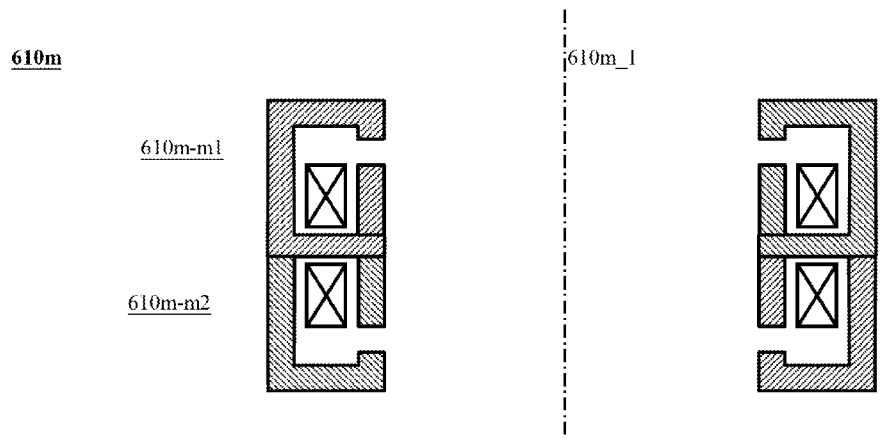
Figure 13B (Invention)

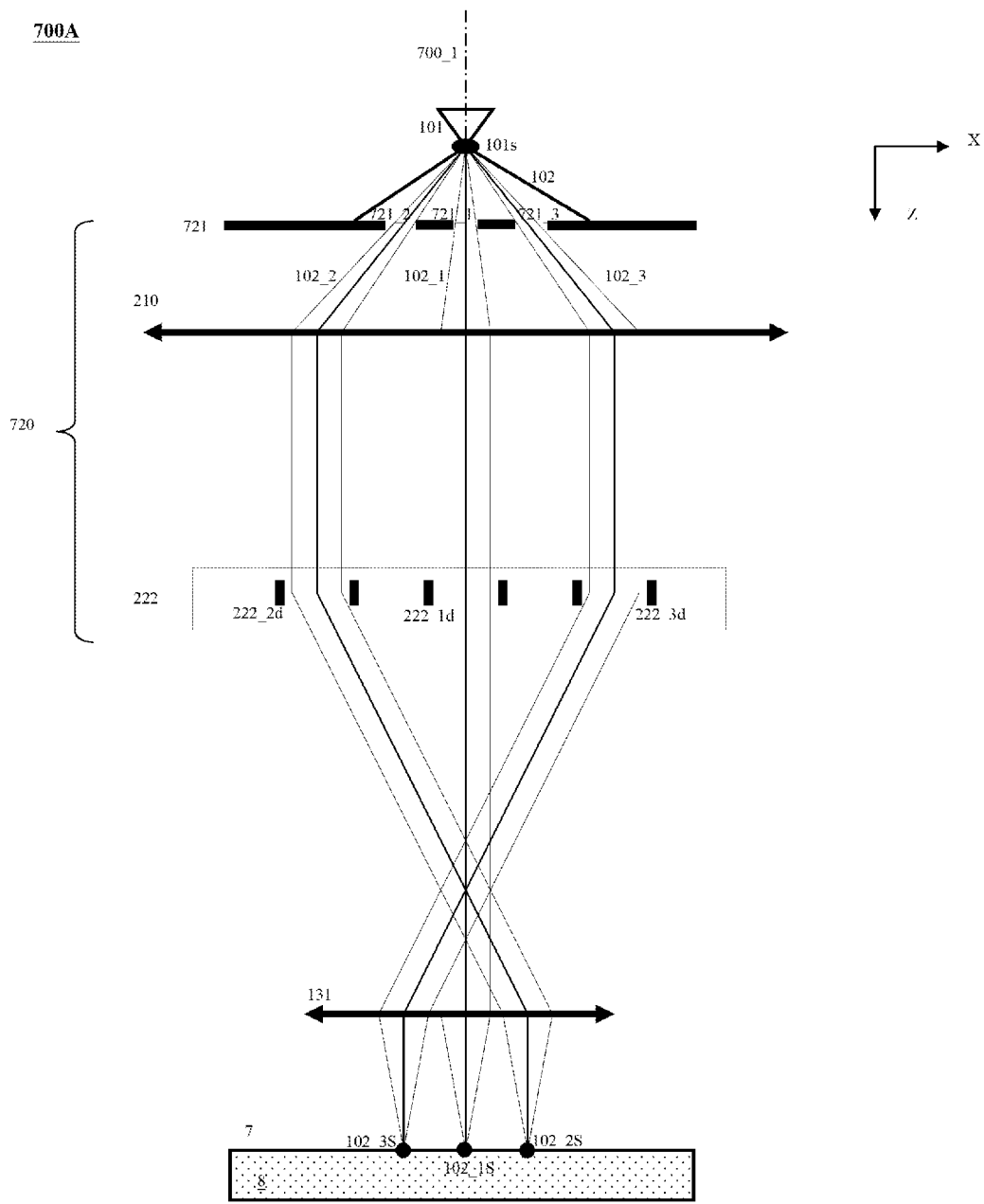
Figure 14 (Invention)

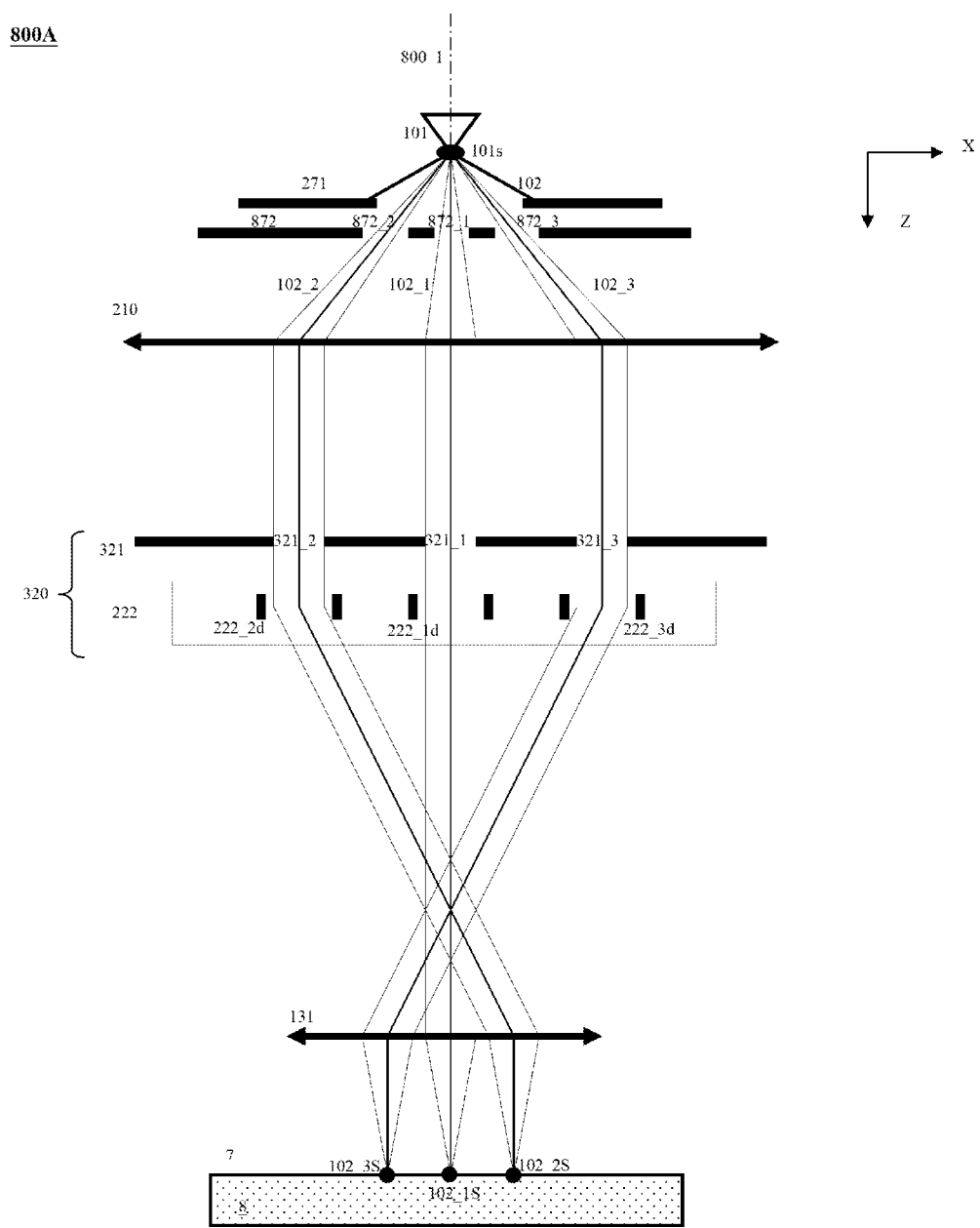
Figure 15A (Invention)

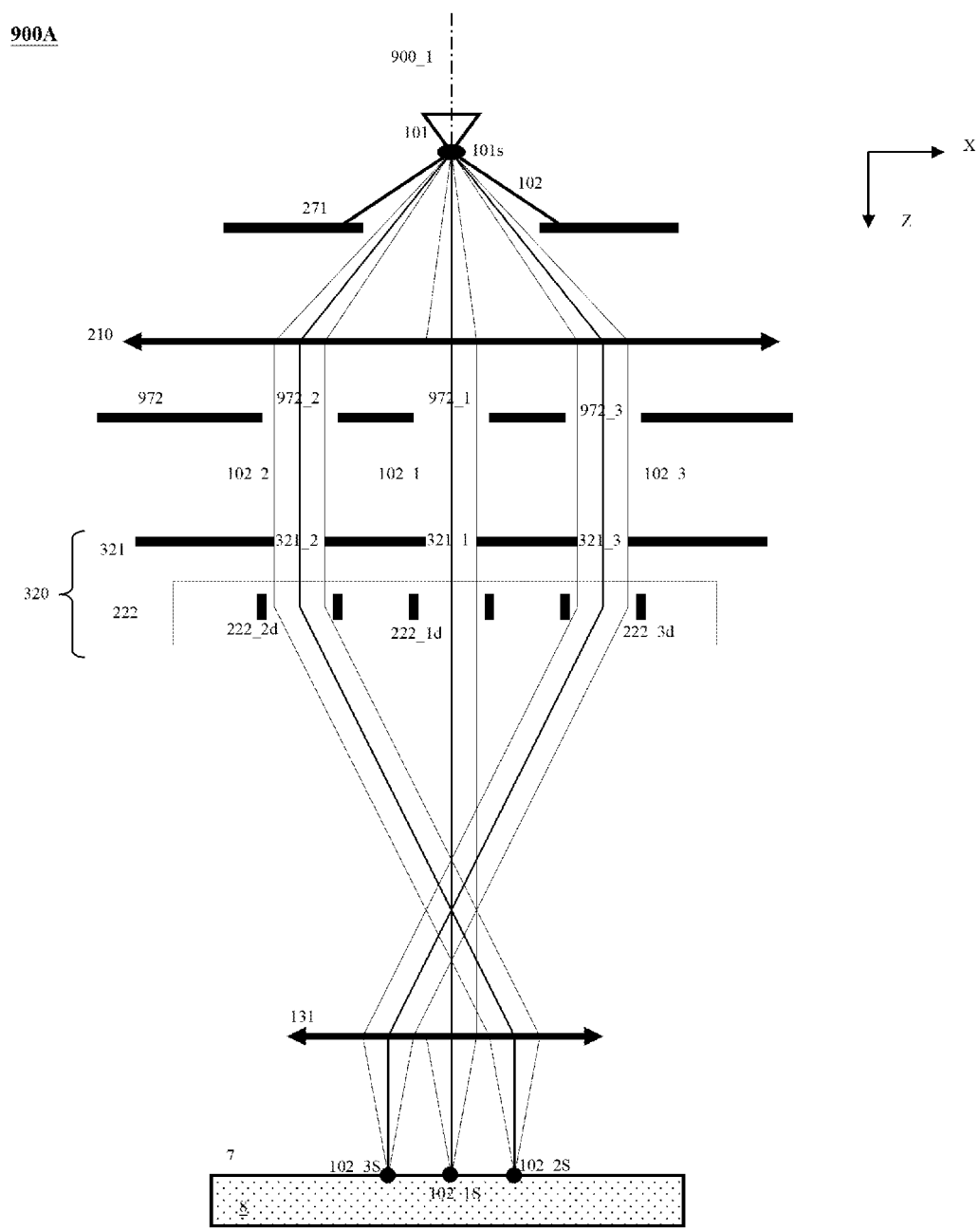
Figure 15B (Invention)

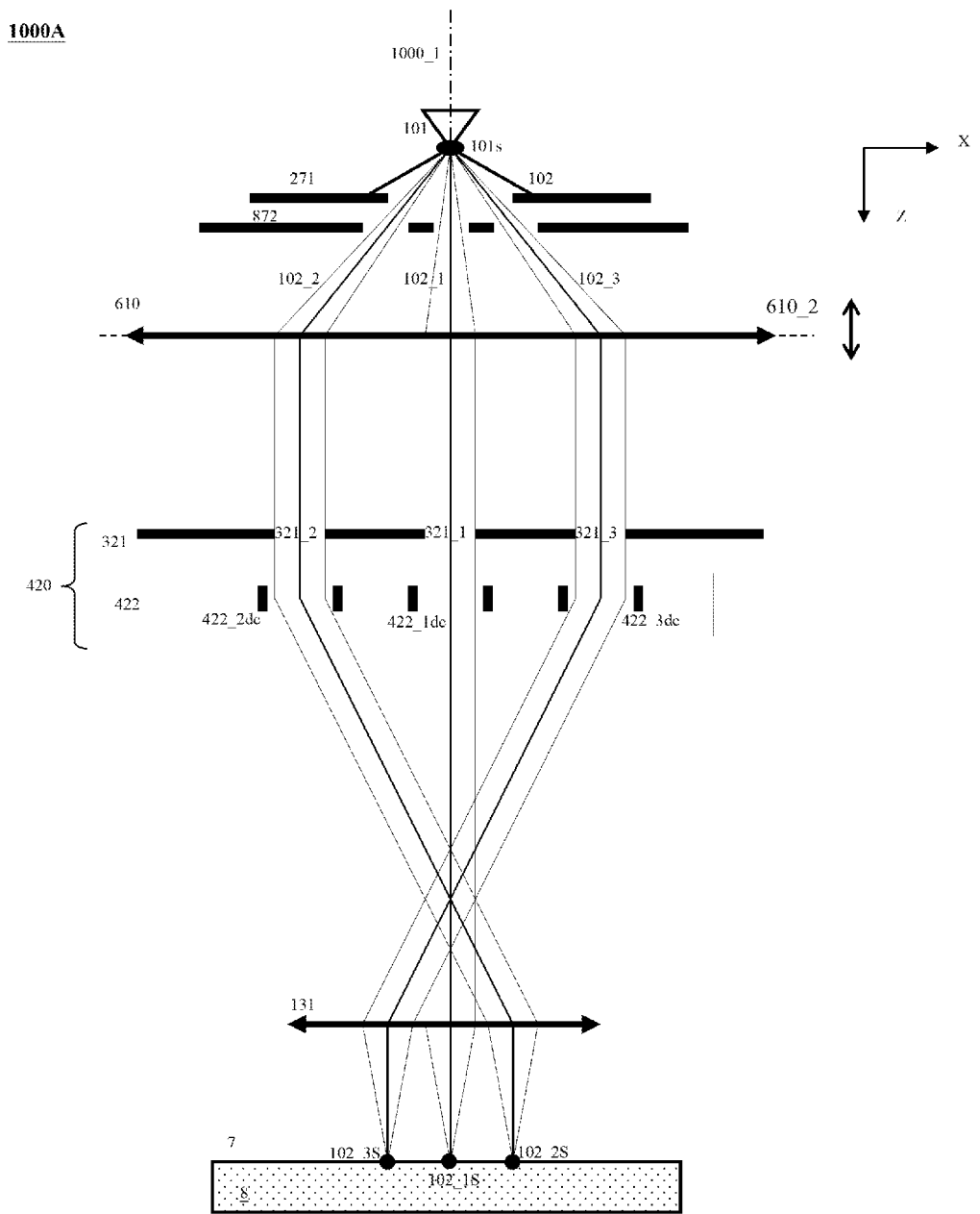
Figure 16 (Invention)

APPARATUS OF PLURAL CHARGED-PARTICLE BEAMS

CLAIM OF PRIORITY

This application claims the benefit of priority of U.S. provisional application No. 62/195,353 entitled to Ren et al. filed Jul. 22, 2015 and entitled "Apparatus of Plural Charged-Particle Beams", the entire disclosures of which are incorporated herein by reference.

CROSS REFERENCE TO RELATED APPLICATIONS

This application is related to U.S. application Ser. No. 15/065,342 entitled to Weiming Ren et al. filed on Mar. 9, 2016 and entitled "Apparatus of Plural Charged-Particle Beams", the entire disclosures of which are incorporated herein by reference.

This application is related to U.S. application Ser. No. 15/078,369 entitled to Weiming Ren et al. filed on Mar. 23, 2016 and entitled "Apparatus of Plural Charged-Particle Beams", the entire disclosures of which are incorporated herein by reference.

This application is related to U.S. application Ser. No. 15/150,858 entitled to Xuedong Liu et al. filed on May 10, 2016 and entitled "Apparatus of Plural Charged-Particle Beams", the entire disclosures of which are incorporated herein by reference.

This application is related to U.S. application Ser. No. 15/213,781 entitled to Shuai Li et al. filed on Jul. 19, 2016 and entitled "Apparatus of Plural Charged-Particle Beams", the entire disclosures of which are incorporated herein by reference.

BACKGROUND OF THE INVENTION

1. Field of the Invention

The present invention relates to a charged-particle apparatus with a plurality of charged-particle beams. More particularly, it relates to an apparatus which employs plural charged-particle beams to simultaneously acquire images of plural scanned regions of an observed area on a sample surface. Hence, the apparatus can be used to inspect and/or review defects on wafers/masks with high resolution and high throughput in semiconductor manufacturing industry.

2. Description of the Prior Art

For manufacturing semiconductor IC chips, pattern defects and/or uninvited particles (residuals) inevitably appear on a wafer and/or a mask during fabrication processes, which reduce the yield to a great degree. To meet the more and more advanced requirements on performance of IC chips, the patterns with smaller and smaller critical feature dimensions have been adopted. Accordingly, the conventional yield management tools with optical beam gradually become incompetent due to diffraction effect, and yield management tools with electron beam are more and more employed. Compared to a photon beam, an electron beam has a shorter wavelength and thereby possibly offering superior spatial resolution. Currently, the yield management tools with electron beam employ the principle of scanning electron microscope (SEM) with a single electron beam, which therefore can provide higher resolution but can not provide throughputs competent for mass production. Although a higher and higher current of the single electron beam can be used to increase the throughputs, the superior spatial resolutions will be fundamentally deteriorated by the Coulomb Effect which increases with the beam current.

For mitigating the limitation on throughput, instead of using a single electron beam with a large current, a promising solution is to use a plurality of electron beams each with a small current. The plurality of electron beams forms a plurality of probe spots on one being-inspected or observed surface of a sample. The plurality of probe spots can respectively and simultaneously scan a plurality of small scanned regions within a large observed area on the sample surface. The electrons of each probe spot generate secondary electrons from the sample surface where they land on. The secondary electrons comprise slow secondary electrons (energies ≤50 eV) and backscattered electrons (energies close to landing energies of the electrons). The secondary electrons from the plurality of small scanned regions can be respectively and simultaneously collected by a plurality of electron detectors. Consequently, the image of the large observed area including all of the small scanned regions can be obtained much faster than that scanned with a single beam.

The plurality of electron beams can be either from a plurality of electron sources respectively, or from a single electron source. For the former, the plurality of electron beams is usually focused onto and scans the plurality of small scanned regions within a plurality of columns respectively, and the secondary electrons from each scanned region are detected by one electron detector inside the corresponding column. The apparatus therefore is generally called as a multi-column apparatus. The plural columns can be either independent or share a multi-axis magnetic or electromagnetic-compound objective lens (such as U.S. Pat. No. 8,294, 095). On the sample surface, the beam interval between two adjacent beams is usually as large as 30~50 mm.

For the latter, a source-conversion unit virtually changes the single electron source into a plurality of sub-sources. The source-conversion unit comprises one beamlet-forming (or beamlet-limit) means with a plurality of beam-limit openings and one image-forming means with a plurality of electron optics elements. The plurality of beam-limit openings divides the primary-electron beam generated by the single electron source into a plurality of sub-beams or beamlets respectively, and the plurality of electron optics elements influence the plurality of beamlets to form a plurality of parallel (virtual or real) images of the single electron source. Each image can be taken as one sub-source which emits one corresponding beamlet. To make more beamlets available, the beamlet intervals are at micro meter level. Naturally, one primary projection imaging system and one deflection scanning unit within one single column are used to project the plurality of parallel images onto and scan the plurality of small scanned regions respectively. The plurality of secondary electron beams therefrom is directed by one beam separator into one secondary projection imaging system, and then focused by the secondary projection imaging system to be respectively detected by a plurality of detection elements of one electron detection device inside the single column. The plurality of detection elements can be a plurality of electron detectors placed side by side or a plurality of pixels of one electron detector. The apparatus therefore is generally called as a multi-beam apparatus.

The beamlet-forming (or beamlet-limit) means is usually an electric-conduction plate with through-holes, and a plurality of through-holes therein function the plurality of beam-limit openings respectively. Two methods have been used to form the plurality of parallel images by the image-forming means. For the first one, each electron optics element has an electrostatic micro-lens which focuses one beamlet and therefore forms one real image, such as U.S. Pat. No. 7,244,949. For the second one, each electron optics element has a electrostatic micro-deflector which deflects one beamlet and therefore forms one virtual image, such as U.S. Pat. No. 6,943,349 and first cross reference. The concept of using an electrostatic deflector to form a virtual image of an electron source was used in the famous two-slit electron interference experiments as early as in 1950s (FIG. 1 of the paper "The Merli-Missiroli-Pozzi Two-Slit Electron-Interference Experiment" published in Physics in Perspective, 14 (2012) 178-195 by Rodolfo Rosa). Coulomb Effect in the second method is weaker than in the first method due to one real image has a higher current density, and hence the second method is more advantageous for achieving both high throughput and high resolution.

To reduce aberrations of the plurality of probe spots, the primary projection imaging system basically comprises one transfer lens and one objective lens, and the transfer lens bends the plurality of beamlets to pass through the objective lens as close to the optical axis thereof as possible. For a source-conversion unit with the second method, the bending function of the transfer lens can be done by the plurality of micro-deflectors, and therefore the transfer lens can be removed, as proposed in the first cross reference and shown in FIG. 1. Without the transfer lens, the projection imaging system will be simplified and easy in manufacturing and operation.

In FIG. 1, the electron source 101 on the primary optical axis 100_1 generates the primary electron beam 102 with a source crossover (virtual or real) 101s. The condenser lens 110 focuses the primary-electron beam 102 incident onto the source-conversion unit 120 with a desired current density. The peripheral electrons of the primary electron beam 102 are cut off by the main opening of the main aperture plate 171, which can also be placed above the condenser lens no. Three beamlets (102_1, 102_2 and 102_3) of the primary-electron beam 102 are respectively deflected towards the primary optical axis 100_1 by the three micro-deflectors (122_1, 122_2 and 122_3) of the image-forming mean 122, and pass through three beam-limit openings (121_1, 121_2 and 121_3) of the beamlet-limit means 121. Then, the three virtual images (102_1v, 102_2v and 102_3v) formed by the deflected three beamlets are projected by the objective lens 131 onto the surface 7 of the sample 8 and three probe spots (102_1s, 102_2s and 102_3s) therefore are formed thereon.

If the three beamlets are deflected close to or passing through the front focal point of the objective lens 131, they will perpendicularly land on the sample surface 7 and aberrations of the off-axis probe spots (such as 102_2s) due to the objective lens 131 will decrease to a great degree. However, in this case, the deflection angles of the three beamlets become larger, which not only require stronger deflection powers of the three micro-deflectors but also generate larger deflection aberrations. The first issue may incur electric breakdown of the three micro-deflectors, and the second issue may enlarge the sizes of the off-axis probe spots to an unacceptable level.

The beam-limit openings limit the currents of the three probe spots, and the currents are changed by tuning the focusing power of the condenser lens 110 to vary the current density of the primary electron beam 102. For the three micro-deflectors, the incident angles of the three beamlets change with the focusing power, and the deflection powers thereof need adjusting accordingly. The time and the effort for changing observing conditions are the less the better.

Accordingly, it is necessary to provide a multi-beam apparatus which has no or fewer foregoing issues, and therefore can provide high image resolution and high throughput. Especially, a multi-beam apparatus which can inspect and/or review defects on wafers/masks with high resolution and high throughput is needed to match the roadmap of the semiconductor manufacturing industry.

SUMMARY OF THE INVENTION

The object of this invention is to provide a new multi-beam apparatus which provide both high resolution and high throughput for observing a sample in flexibly varying observing conditions (such as currents and landing energies of the probe spots, electrostatic field on the sample surface). The apparatus can function as a yield management tool to inspect and/or review defects on wafers/masks in semiconductor manufacturing industry.

In the apparatus, one condenser collimates or substantially collimates the primary-electron beam into one source-conversion unit, the source-conversion unit deflects a plurality of beamlets of the primary-electron beam towards the optical axis of one objective lens, and the objective lens focuses the plurality of deflected beamlets onto one being-observed surface of one sample and therefore a plurality of probe spots is formed thereon, wherein the deflection angles of the plurality of deflected beamlets are adjusted to reduce the sizes of the plurality of probe spots. The currents of the plurality of probe spots can be varied by changing either or both of the focusing power and the position of the first principal plane of the condenser lens. The source-conversion unit can further reduce the sizes and the size differences of the plurality of probe spots by compensating off-axis aberrations thereof. Furthermore, to weaken the Coulomb effect due to the primary-electron beam as much as possible, the beamlet-forming means of the source conversion unit can be placed close to the single electron source, a pre-beamlet-forming means can be employed close to the single electron source.

Accordingly, the invention therefore provides a multi-beam apparatus, which comprises an electron source, a condenser lens below the electron source, a source-conversion unit below the condenser lens, an objective lens below the source-conversion unit, a deflection scanning unit below the source-conversion unit, a sample stage below the objective lens, a beam separator below the source-conversion unit, a secondary projection imaging system, and an electron detection device with a plurality of detection elements. The electron source, the condenser lens and the objective lens are aligned with a primary optical axis of the apparatus, and the sample stage sustains the sample so that the surface faces to the objective lens. The source-conversion unit comprises a beamlet-forming means with a plurality of beam-limit openings and an image-forming means with a plurality of electron optics elements. The electron source generates a primary-electron beam along the primary optical axis, and the primary-electron beam is focused by the condenser lens to become a substantially parallel beam and then incident into the source-conversion unit. A plurality of beamlets of the primary-electron beam exits from the source-conversion unit, which respectively passes through the plurality of beam-limit openings and is deflected by the plurality of electron optics elements towards the primary optical axis, and deflection angles of the plurality of beamlets are different. The plurality of beamlets, focused by the objective lens onto the surface and forms a plurality of probe spots thereon, is deflected by the deflection scanning unit to scan the plurality of probe spots respectively over a plurality of scanned regions within an observed area on the surface, and currents of the plurality of probe spots are limited by the plurality of beam-limit openings. A plurality of secondary electron beams, generated by the plurality of probe spots respectively from the plurality of scanned regions and directed into the secondary projection imaging system by the beam separator, is focused by the secondary projection imaging system to keep the plurality of secondary electron beams to be detected by the plurality of detection elements respectively, and each detection element therefore provides an image signal of one corresponding scanned region.

In one embodiment, the deflection angles can be individually set to reduce aberrations of the plurality of probe spots respectively. The plurality of electron optics elements is below and aligned with the plurality of beam-limit openings respectively. Each of the plurality of electron optics elements can be a 4-pole lens. Currents of the plurality of probe spots are varied by using the condenser lens to change a current density of the primary-electron beam incident into the source-conversion unit. The apparatus may further comprise a pre-beamlet-forming means with a plurality of beamlet-forming apertures above the source-conversion unit, wherein the plurality of beamlets passes through the plurality of beamlet-forming apertures respectively and most of electrons outside the plurality of beamlets are cut off.

The plurality of electron optics elements, in this embodiment, can compensate one or up to all of field curvature, astigmatism and distortion aberrations of the plurality of probe spots to further reduce sizes and distortions thereof. Each of the plurality of electron optics elements can be an 8-pole lens. Each of the plurality of electron optics elements may comprise one micro-lens and two 4-pole lenses which are aligned with and placed along an optical axis of the each element, and the two 4-pole lenses have a 45° difference in azimuth. For that each of the plurality of electron optics elements, one of the two 4-pole lenses is on a beamlet exit side and one corresponding beamlet is deflected by the one 4-pole lens.

The condenser lens, in one embodiment, may comprise multiple annular electrodes which are placed at different axial positions along and aligned with the primary optical axis, and voltages thereof can be adjusted to change the current density. The condenser lens, in another embodiment, may comprise at least two single magnetic lenses which are placed at different axial positions along and aligned with the primary optical axis, and excitations thereof can be adjusted to change the current density of the primary-electron beam incident into the source-conversion unit. The condenser lens, in still another embodiment, may comprise multiple annular electrodes and at least one single magnetic lens which are placed at different axial positions along and aligned with the primary optical axis, and voltages of the electrodes and excitations of the at least one single magnetic lens can be adjusted to change the current density.

Landing energies of the plurality of beamlets on the surface are varied by changing a potential thereof.

The present invention also provides a multi-beam apparatus, which comprises an electron source, a condenser lens below the electron source, a source-conversion unit below the condenser lens, an objective lens below the source-conversion unit, a deflection scanning unit below the source-conversion unit, a sample stage below the objective lens, a beam separator below the source-conversion unit, a secondary projection imaging system, and an electron detection device with a plurality of detection elements. The electron source, the condenser lens and the objective lens are aligned with a primary optical axis of the apparatus, and the sample stage sustains the sample so that the surface faces to the objective lens. The source-conversion unit comprises a beamlet-forming means with a plurality of beam-limit openings and an image-forming means with a plurality of electron optics elements. The electron source generates a primary-electron beam along the primary optical axis, which is focused by the condenser lens, and then is incident into the source-conversion unit with a convergent or divergent angle. A plurality of beamlets of the primary-electron beam exits from the source-conversion unit, respectively passes through the plurality of beam-limit openings, and is deflected by the plurality of electron optics elements towards the primary optical axis. The plurality of beamlets is focused by the objective lens onto the surface and forms a plurality of probe spots thereon. Deflection angles of the plurality of beamlets are individually set to reduce aberrations of the plurality of probe spots respectively, and the deflection scanning unit deflects the plurality of beamlets to scan the plurality of probe spots respectively over a plurality of scanned regions within an observed area on the surface. Currents of the plurality of probe spots are limited by the plurality of beam-limit openings. A plurality of secondary electron beams, generated by the plurality of probe spots respectively from the plurality of scanned regions and directed into the secondary projection imaging system by the beam separator. The secondary projection imaging system focuses and keeps the plurality of secondary electron beams to be detected by the plurality of detection elements respectively, and each detection element therefore provides an image signal of one corresponding scanned region.

The plurality of electron optics elements could compensate one or up to all of field curvature, astigmatism and distortion aberrations of the plurality of probe spots to further reduce sizes and distortions thereof. Currents of the plurality of probe spots are varied by using the condenser lens to adjust a current density of the primary-electron beam incident into the source-conversion unit. The plurality of electron optics elements may be below the plurality of beam-limit openings. The apparatus may further comprise a pre-beamlet-bending means with a plurality of pre-bending micro-deflectors respectively above the plurality of beam-limit openings. The plurality of pre-bending micro-deflectors may deflect the plurality of beamlets to be perpendicularly incident into the plurality of beam-limit openings. The apparatus may further comprise a pre-beamlet-forming means with a plurality of beamlet-forming apertures above the source-conversion unit, wherein the plurality of beamlets passes through the plurality of beamlet-forming apertures respectively and most of electrons outside the plurality of beamlets are cut off.

The present invention also provides a multi-beam apparatus, which comprises an electron source, a beamlet-forming plate providing a plurality of beam-limit openings below the electron source, a condenser lens below the beamlet-forming plate, a plurality of electron optics elements below the condenser lens, an objective lens below the plurality of electron optics elements, a deflection scanning unit below the plurality of electron optics elements, a sample stage below the objective lens, a beam separator below the plurality of electron optics elements, a secondary projection imaging system, and an electron detection device with a plurality of detection elements. The electron source, the condenser lens and the objective lens are aligned with a primary optical axis of the apparatus, and the sample stage sustains the sample so that the surface faces to the objective lens. The electron source generates a primary-electron beam along the primary optical axis, which is trimmed by the beamlet-forming plate into a plurality of beamlets respectively passing through a plurality of through-holes of a first group therein, and the plurality of through-holes functions as a plurality of beam-limit openings of the apparatus. The condenser lens focuses the plurality of beamlets to be deflected by the plurality of electron optics elements respectively towards the primary optical axis. The plurality of beamlets is focused by the objective lens onto the surface and forms a plurality of probe spots thereon, and deflection angles of the plurality of beamlets are individually set to reduce aberrations of the plurality of probe spots respectively. The deflection scanning unit deflects the plurality of beamlets to scan the plurality of probe spots respectively over a plurality of scanned regions within an observed area on the surface, and currents of the plurality of probe spots are limited by the plurality of beam-limit openings. A plurality of secondary electron beams is generated by the plurality of probe spots respectively from the plurality of scanned regions and directed into the secondary projection imaging system by the beam separator. The secondary projection imaging system focuses and keeps the plurality of secondary electron beams to be detected by the plurality of detection elements respectively, and each detection element therefore provides an image signal of one corresponding scanned region.

The plurality of beamlets is perpendicularly incident into the plurality of electron optics elements. The plurality of electron optics elements compensates one or up to all of field curvature, astigmatism and distortion aberrations of the plurality of probe spots to further reduce sizes and distortions thereof. Currents of the plurality of beamlets, in one embodiment, can be varied by adjusting an angular intensity of the electron source. Currents of the plurality of beamlets, in another embodiment, can be varied by changing radial sizes of the plurality of beam-limit openings. The radial sizes are changed by moving the beamlet-forming plate to locate a plurality of through-holes of a second group therein as the plurality of beam-limit openings.

The present invention also provides a method to form a plurality of probe spots in a SEM, which comprises steps of generating a primary-electron beam by an electron source, collimating or substantially collimating the primary-electron beam by a condenser lens, trimming the collimated primary-electron beam into a plurality of beamlets by a first plate with first through-holes, deflecting the plurality of beamlets towards an optical axis of an objective lens with different deflection angles by a plurality of electron optics elements, and focusing the plurality of deflected beamlets onto a being-observed surface of a sample by the objective lens, wherein the plurality of deflected and focused beamlets forms the plurality of probe spots.

The method may further comprise a step of individually setting the deflection angles to reduce aberrations of the plurality of probe spots respectively. The method may further comprise a step of compensating one or up to all of field curvature, astigmatism and distortion aberrations of the plurality of probe spots by the plurality of electron optics elements. The method may further comprise a step of varying a current density of the collimated primary-electron beam by moving a first principal plane of the condenser lens. The method may further comprise a step of cutting off most of electrons outside the plurality of beamlets by a second plate with second through-holes before the trimming step.

The present invention also provides a method to form a plurality of probe spots in a SEM, which comprises generating a primary-electron beam by an electron source, trimming the primary-electron beam into a plurality of beamlets by a plate with a plurality of through-holes, focusing the plurality of beamlets by a condenser lens, deflecting the plurality of beamlets towards an optical axis of an objective lens by a plurality of electron optics elements, focusing the plurality of deflected beamlets onto a being-observed surface of a sample by the objective lens, wherein the plurality of deflected and focused beamlets forms the plurality of probe spots, and setting deflection angles of the plurality of deflected beamlets individually to reduce aberrations of the plurality of probe spots respectively.

The method may further comprise a step of compensating one or up to all of field curvature, astigmatism and distortion aberrations of the plurality of probe spots by the plurality of electron optics elements. The method may further comprise a step of varying currents of the plurality of beamlets by changing an angular intensity of the electron source. The method may further comprise a step of changing currents of the plurality of beamlets by using another plurality of through-holes of the plate in the trimming step.

The present invention also provides a device for providing multiple sources, which comprises a charged-particle source for providing a primary beam along an optical axis of the device, means for substantially collimating the primary beam, and means for imaging a plurality of virtual images of the charged-particle source with a plurality of beamlets of the collimated primary beam, wherein the plurality of virtual images becomes the multiple sources which emit the plurality of beamlets respectively.

The device may further comprise means for varying currents of the plurality of beamlets. The device may further comprise means for suppressing Coulomb effect due to the primary beam.

The present invention also provides a multi-beam apparatus, which comprises the device for providing the multiple sources, means for projecting the plurality of virtual images on a sample surface such that a plurality of probe spots is formed thereon, means for scanning the plurality of probe spots on the sample surface, and means for receiving a plurality of signal particle beams generated from the sample surface due to plurality of probe spots. The multi-beam apparatus may further comprise means for individually deflecting the plurality of beamlets to reduce aberrations of the plurality of probe spots respectively. The multi-beam apparatus may further comprise means for individually compensating the aberrations of the plurality of probe spots. The projecting means is a single objective lens.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a schematic illustration of a conventional multi-beam apparatus disclosed in the first cross reference.

FIG. 2 is a schematic illustration of one configuration of a new multi-beam apparatus in accordance with one embodiment of the present invention.

FIG. 3 is a schematic illustration of another configuration of the new multi-beam apparatus in accordance with another embodiment of the present invention.

FIG. 4 is a schematic illustration of another configuration of the new multi-beam apparatus in accordance with another embodiment of the present invention.

FIG. 5 is a schematic illustration of one configuration of the micro-deflector-and-compensator array in FIG. 4 in accordance with another embodiment of the present invention.

FIG. 6A is a schematic illustration of one configuration of the micro-deflector-and-compensator array in FIG. 4 in accordance with another embodiment of the present invention.

FIGS. 6B-6D are schematic illustrations of one example of the configuration of the micro-deflector-and-compensator array in FIG. 6A in accordance with another embodiment of the present invention.

FIG. 7A and FIG. 7B are respectively a schematic illustration of one configuration of the micro-deflector-and-compensator array in FIG. 4 in accordance with another embodiment of the present invention.

FIG. 8 is a schematic illustration of one operation mode of the apparatus in FIG. 3.

FIG. 9 is a schematic illustration of another configuration of the new multi-beam apparatus in accordance with another embodiment of the present invention.

FIG. 10 is a schematic illustration of another configuration of the new multi-beam apparatus in accordance with another embodiment of the present invention.

FIG. 11A and FIG. 11B are respectively a schematic illustration of one operation mode of the apparatus in FIG. 10.

FIG. 12, FIG. 13A and FIG. 13B are respectively a schematic illustration of one embodiment of the movable condenser lens in FIG. 10.

FIG. 14 is a schematic illustration of another configuration of the new multi-beam apparatus in accordance with another embodiment of the present invention.

FIG. 15A is a schematic illustration of another configuration of the new multi-beam apparatus in accordance with another embodiment of the present invention.

FIG. 15B is a schematic illustration of another configuration of the new multi-beam apparatus in accordance with another embodiment of the present invention.

FIG. 16 is a schematic illustration of another configuration of the new multi-beam apparatus in accordance with another embodiment of the present invention.

DETAILED DESCRIPTION OF EXAMPLE EMBODIMENTS

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of an electron optics element (such as a round lens or a multipole lens), or an apparatus", "radial" means "in a direction perpendicular to the optical axis", "on-axial" means "on or aligned with the optical axis", and "off-axis" means "not on or not aligned with the optical axis".

In this invention, X, Y and Z axe form Cartesian coordinate, the optical axis is on the Z-axis and a primary-electron beam travels along the Z-axis.

In this invention, "primary electrons" means "electrons emitted from an electron source and incident onto a being-observed or inspected surface of a sample, and "secondary electrons" means "electrons generated from the surface by the "primary electrons"

In this invention, all terms relate to through-holes, openings and orifices mean openings or holes penetrated through one plate.

In the new multi-beam apparatus, the primary-electron beam is focused parallel or substantially parallel into one source-conversion unit by one condenser. A plurality of beamlets of the primary-electron beam is at first deflected by the source-conversion unit towards the optical axis of one objective lens, then focused by the objective lens onto the sample surface, and finally forms a plurality of probe spots thereon. The deflection angles of the plurality of deflected beamlets are set to minimize the off-axis aberrations due to the objective lens. The currents of the plural probe spots can be varied by changing either or both of the focusing power and the position of the first principal plane of the condenser lens, and the sizes and their size differences of the plural probe spots can be further reduced by compensating the residual off-axis aberrations by the source-conversion unit. In addition, for the plural probe spots, the blurs due to strong Coulomb effect of the primary-electron beam can be reduced by placing the beamlet-forming means of the source-conversion unit close to the single electron source or additionally using one pre-beamlet-forming means above the source-conversion unit.

Next, some embodiments of the new apparatus will be described. For sake of clarity, only three beamlets are shown and the number of beamlets can be anyone. The deflection scanning unit, the beam separator, the secondary projection imaging system and the electron detection device in prior art can be used here, and for sake of simplification, they are not shown or even not mentioned in the illustrations and the description of the embodiments.

One embodiment 200A of the new apparatus is shown in FIG. 2. In FIG. 2, the election source 101, the main opening of the main aperture plate 271, the condenser 210, the source-conversion unit 220 and the objective lens 131 are aligned with the primary optical axis 200_1 of the apparatus. The electron source 101 generates a primary-electron beam 102 along the primary optical axis 200_1 and with a source crossover (virtual or real) 101$s$, the condenser lens 210 focuses the primary-electron beam 102 to become a parallel beam along the primary optical axis 200_1 and perpendicularly incident onto the source-conversion unit 220. In the source-conversion unit 220, three beamlets 102_1, 102_2 and 102_3 of the primary-electron beam 102 are respectively deflected by three micro-deflectors 222_1$d$, 222_2$d$ and 222_3$d$ of the image-forming means 222 towards the primary optical axis 200_1 and pass through three beam-limit openings 221_1, 221_2 and 221_3 of the beamlet-limit means 221. The three beam-limit openings limit currents of the three deflected beamlets. The objective lens 131 focuses the three deflected beamlets onto the surface 7 of the sample 8, and accordingly generates three images 102_1s, 102_2s and 102_3s of the source crossover 101s thereon. Each image forms one probe spot on the surface 7, and the three images are also called as three probe spots 102_1s, 102_2s and 102_3s. The deflection angles of the three deflected beamlets are set to minimize the off-axis aberrations of the three images due to the objective lens 131, wherein the three deflected beamlets typically pass through or approach the front focal point of the objective lens 131. The main aperture plate 271 cuts the peripheral electrons of the primary-electron beam 102 to reduce the Coulomb Effect thereof as much as possible.

The beamlet-forming means 221 can be an electric-conduction plate with through-holes, and three through-holes therein function as the three beam-limit openings (221_1~221_3) respectively. In FIG. 2, the three deflected beamlets (102_1~102_3) do not perpendicularly pass through the three beam-limit openings (221_1~221_3), and therefore suffers electron scatterings to a certain degree related to the deflection angles. The scattering electrons in each beamlet will enlarge the probe spot and/or become a background noise and therefore deteriorate the image resolution of the corresponding scanned region. To avoid this issue, the currents of the three beamlets can be cut when the three beamlets are parallel to the primary optical axis 200_1. Accordingly, another embodiment 300A of the new apparatus is proposed in FIG. 3. In comparison with the embodiment 200A in FIG. 2, the beamlet-limit means 221 is placed above the image-forming means 222 and renamed as beamlet-forming means 321 in the source-conversion unit 320 in FIG. 3. The three beam-limit openings 321_1, 321_2 and 321_3 of the beamlet-forming means 321 are respectively aligned with the three micro-deflectors 222_1d, 222_2d and 222_3d of the image-forming means 222, and the three beamlets 102_1, 102_2 and 102_3 are perpendicularly incident into the three beam-limit openings and the three micro-deflectors in succession.

As well known, the condenser lens 210 and the objective lens 131 generate off-axis aberrations (such as field curvature, astigmatism and distortion) which enlarge the sizes and/or influence the positions of the probe spots formed by those off-axis beamlets (not along the primary optical axis of the apparatus). As mentioned above, the off-axis aberrations due to the objective lens 131 have been minimized by individually optimizing the trajectories of the off-axis beamlets (i.e. appropriately setting the deflection angles thereof). To further reduce the sizes and size differences of the probe spots, the off-axis aberrations due to the condenser lens 210 and the residual off-axis aberrations due to the objective lens 131 have to be compensated. Accordingly another embodiment 400A of the new apparatus is proposed in FIG. 4, wherein the image-forming means 422 has three micro-deflector-and-compensator elements 422_1dc, 422_2dc and 422_3dc. Each micro-deflector-and-compensator element is aligned with one of three beam-limit openings 321_1, 321_2 and 321_3 of the beamlet-forming means 321, functions as one micro-deflector to deflect one beamlet and one micro-compensator to compensate the field curvature, astigmatism and distortion of the corresponding probe spot.

Each of three micro-deflectors (222_1d~222_3d) in FIG. 2 and FIG. 3 can simply be formed by a dipole lens whose two electrodes is oriented to generate a dipole field in the required deflection direction of the corresponding beamlet, or a quadrupole or 4-pole lens whose four electrodes can generate a dipole field in any desired direction. In the later case, all the micro-deflectors can be configured to be same in structure and orientation. This is advantageous from the manufacturing point of view.

In FIG. 4, each of three micro-deflector-and-compensator elements (422_1dc~422_3d) can simply be formed by a 4-pole lens whose four electrodes can generate a dipole field in any desired direction, a round-lens field and a quadrupole field in the required compensation direction of the corresponding probe spot, or a octupole or 8-pole lens whose eight electrodes can generate a round-lens field, a dipole field and a quadrupole field both in any desired direction. To generate a round-lens field, the inner surfaces of the four or the eight electrodes form a circular shape in a radial cross-section, as shown in FIG. 5. In the later case, all the micro-deflector-and-compensator elements can be configured to be same in structure and orientation. This is advantageous from the manufacturing point of view.

To generate all the foregoing fields, the voltages of the electrodes in one 4-pole lens or 8-pole lens are different and may be high enough to incur electric breakdown. To avoid this issue, each micro-deflector-and-compensator element can be formed by two or more micro-multipole-lenses, or one or more micro-multipole-lenses and one or more micro-lens. In addition, to reduce aberrations due to each micro-deflector-and-compensator element, the corresponding beamlet is better passing through the round-lens field and the quadrupole field along the optical axis thereof, i.e. the off-axis aberration compensation is better done before the beamlet deflection. Hence the dipole field is better generated by the micro-multipole-lens on the beamlet exit side of each micro-deflector-and-compensator element. Accordingly, FIG. 6A shows such an embodiment of the image-forming means 422 in FIG. 4, wherein each of three micro-deflector-and-compensator elements (422_1dc-422_3dc) is formed by one micro-lens in the first layer 422-1, one micro-multipole-lens in the second layer 422-2 and one micro-multipole-lens in the third layer 422-3, and the micro-lens and the two micro-multipole-lenses are aligned with its optical axis. For example, the micro-lens 422-1_2 and two micro-multipole-lenses 422-2_2 and 422-3_2 form the micro-deflector-and-compensator element 422_2dc and are aligned with the optical axis 422_2dc_1 thereof.

In each micro-deflector-and-compensator element in FIG. 6A, the two micro-multipole-lenses can respectively be a dipole lens and a 4-pole lens, or a dipole lens and an 8-pole lens, or a 4-pole lens, etc. FIGS. 6B, 6C and 6D show one example, wherein each micro-lens is formed by one annular electrode with a round inner surface, each micro-multipole-lens is a 4-pole lens, and each 4-pole lens in the second layer 422-2 and the corresponding 4-pole lens in the third layer 422-3 have a 45° difference in azimuth or orientation. For each micro-deflector-and-compensator element, the micro-lens generates the round-lens field, the two 4-pole lenses generate the quadrupole field, and the dipole field is better generated by the 4-pole lens in the third layer 422-3.

To operate one micro-lens-and-compensator element in FIG. 4, a driving-circuit needs connecting with each electrode thereof. To prevent the driving-circuits from being damaged by the beamlets 102_1~102_3, the image-forming means 422 can comprises one electric-conduction cover-plate which has a plurality of through-holes and is placed above the electrodes of all the micro-lens-and-compensator elements. Each through-hole is for the corresponding beamlet passing through. The foregoing fields of each micro-lensand-compensator element are better within a limited range so as to avoid influencing the adjacent beamlets. Therefore it is better to use two electric-conduction shielding-plates to sandwich the electrodes of all the micro-lens-and-compensator elements, wherein each shielding-plate has a plurality of through-holes for the beamlets passing through. FIG. 7A shows one way to implement the foregoing measures in the embodiment in FIG. 6A.

In FIG. 7A, the first-upper and the first-lower electric-conduction plates 422-1-CL1 and 422-1-CL2 are respectively placed above and below the micro-lens 422-1_1, 422-1_2 and 422-1_3 in the first layer 422-1. The first-upper and the first-lower insulator plates 422-1-IL1 and 422-1-IL2, respectively with three first-upper and first-lower orifices for beamlets passing through, support the micro-lenses 422-1_1, 422-1_2 and 422-1_3 and therefore make the first layer 422-1 more stable in configuration. Similarly, in the second layer 422-2, the second-upper and the second-lower electric-conduction plates 422-2-CL1 and 422-2-CL2 are respectively placed above and below the micro-multipole-lenses 422-2_1, 422-2_2 and 422-2_3. The second-upper and the second-lower insulator plates 422-2-IL1 and 422-2-IL2, respectively with three second-upper and second-lower orifices for beamlets passing through, support the micro-lenses 422-2_1, 422-2_2 and 422-2_3 and therefore make the second layer 422-1 more stable in configuration. In the third layer 422-3, the third-upper and the third-lower electric-conduction plates 422-3-CL1 and 422-3-CL2 and the third-upper and the third-lower insulator plates 422-3-IL1 and 422-3-IL2 function the same ways as their counterparts in the second layer 422-2.

In each layer in FIG. 7A, the radial dimensions of the through-holes are preferred smaller than the radial dimensions of the orifices so as to avoid charging-up on the inner sidewalls thereof, and smaller than the inner radial dimensions of the electrodes of the micro-lens/micro-multipole-lens so as to more efficiently reduce the fields leaking out. To reduce the possibility of beamlet incurring electron scattering, each through-hole in the first-upper electric-conduction plate is preferred in an upside-down funnel shape (i.e. the small end is on the beamlet incident side thereof). The beamlet-forming means 321 can be an electric-conduction plate with through-holes, and three through-holes therein functions as the three beam-limit openings (321_1~321_3) respectively. Therefore the beamlet-forming means 321 can be combined with the embodiment of the image-forming means 422 in 7A for simplifications in structure and manufacturing. In FIG. 7B, the beamlet-forming means 321 and the first-upper electric-conduction plate 422-1-CL1 are combined, the first-lower electric-conduction plate 422-1-CL2 and the second-upper electric-conduction plate 422-2-CLA are combined, and the second-lower electric-conduction plate 422-2-CL2 and the third-upper electric-conduction plate 422-3-CL1 are combined.

For the foregoing embodiments of the new apparatus in FIGS. 2, 3 and 4, the currents of the probe spots 102_1s-102_3 can be varied within a small range by adjusting the focusing power of the condenser lens 210 to make the primary-electron beam 102 slightly divergent or convergent. FIG. 8 shows one divergent mode in the embodiment 300 in FIG. 3. In one divergent mode, the current density of the primary-electron beam 102 is smaller than that in the parallel mode in FIG. 3, and therefore the currents of the three beamlets below the beamlet-forming means 321 are reduced. In one divergent/convergent mode of the embodiments in FIG. 3 and FIG. 4, the three beamlets will not perpendicularly pass through the three beam-limit openings (321_1~321_3), and therefore suffers electron scatterings to a certain degree. To avoid this issue, one pre-beamlet-bending means can be placed above the beamlet-forming means 321 of the source-conversion unit 320 in FIG. 3 or 420 in FIG. 4, which comprises three pre-bending micro-deflectors to respectively deflect the three beamlets perpendicularly passing through the three beam-limit openings. FIG. 9 shows how to implement this way in the embodiment 300A in FIG. 3, and in one divergent mode how to operate three pre-bending micro-deflectors 523_1d, 523_2d and 523_3d of the pre-beamlet-bending means 523 of the new source-conversion unit 520 in the corresponding embodiment 500A.

For the foregoing embodiments of the new apparatus in FIGS. 2, 3 and 4, the currents of the probe spots 102_1s-102_3 can be varied within a large range by moving the first principal plane of the condenser 210 and accordingly adjusting the focusing power of the condenser lens 210 to make the primary-electron beam 102 become a parallel beam, i.e. the first principal plane of the condenser lens 210 is movable along the primary optical axis of the new apparatus. When the first principal plane is closer to the electron source 101, the primary-electron beam 102 is focused earlier and with a higher current density, and accordingly the currents of the three beamlets below the beamlet-forming means 321 are increased. The closer to the electron source 101 the first principal plane is, the higher the currents are, and vice versa. Hence as the first principal plane is moved along the primary optical axis, the currents of the three probe spots change accordingly and the three beamlets keep perpendicularly passing through the three beam-limit openings.

FIG. 10 shows one embodiment 600A which uses a movable condenser lens 610 to replace the condense lens 210 in the embodiment 300A in FIG. 3, wherein the first principal plane 610_2 is at position P1 and can be moved along the primary optical axis 600_1 of the apparatus. In FIG. 11A the first principal plane 610_2 is moved from the position P1 to the position P2 further away from the electron source 101, and accordingly the currents of the beamlets 102_1, 102_2 and 102_3 decrease. In FIG. 11B the first principal plane 610_2 is moved from the position P1 to the position P3 closer to the electron source 101, and accordingly the currents of the beamlets 102_1, 102_2 and 102_3 increase. Due to primary-electron beam 102 is kept as a parallel beam when varying the currents of the beamlets, the deflection angles thereof do not need to be re-tuned. This will avoid the time for adjusting the micro-deflectors.

To extend the current variant range, the primary-electron beam 102 in FIG. 11A can be weakly focused so as to keep a divergence, and the primary-electron beam 102 in FIG. 11B can be strongly focused to become a convergent beam. As well known, the size of each probe spot is determined by the Gaussian image size of the source crossover 101s, the geometrical aberrations, the diffraction effect and the Coulomb Effect, and the size can be minimized by balancing these blurs. Adjusting the position of the first principal plane 610_2 of the movable condenser lens 610 will break the balance to a certain degree, and therefore the size of each probe spot may increase when the current thereof is changed. When changing the position of the first principal plane 610_2, slightly remaining an appropriate divergence or convergence of the primary-electron beam 102 can weaken the size increasing of the probe spots.

The displacement of the first principal plane 610_2 can be done by mechanically moving the position of the movable condenser lens 610 or electrically moving the position and/or changing the shape of the round-lens field thereof.

The movable condenser lens 610 can be electrostatic, or magnetic, or electromagnetic compound. FIG. 12 shows one electrostatic embodiment 610e of the movable condenser lens 610, and shapes of the primary-electron beam 102 when the first principal plane 610e_2 is at the positions P1, P2 and P3 respectively. The movable condenser lens 610e is an electrostatic lens with four annular electrodes 610e-e1, 610e-e2, 610e-e3 and 610e-e4 aligned with its optical axis 610e_1. The optical axis 610e_1 is placed coincident with the primary optical axis 600_1. The focusing power and the position of the first principal plane 610e_2 of the embodiment 610e vary with the excitation mode of the annular electrodes 610e-e1~610e-e4. When the electrodes 610e-e1, 610e-e2 and 610e-e4 are at same potentials, by appropriately setting the potential of the electrode 610e-e3, the first principal plane 610e_2 will be at the position P2 close to the electrode 610e-e3 and the primary-electron beam 102 can be collimated over there. When the electrodes 610e-e1, 610e-e3 and 610e-e4 are at same potentials, by appropriately setting the potential of the electrode 610e-e2, the first principal plane 610e_2 will be at the position P3 close to the electrode 610e-e2 and the primary-electron beam 102 can be collimated over there. When the electrodes 610e-e1 and 610e-e4 are at same potentials, by appropriately setting the potentials of the electrodes 610e-e2 and 610e-e3, the first principal plane 610e_2 will be at a position (such as P1) between the electrodes 610e-e2 and 610e-e3 and the primary-electron beam 102 can be collimated over there.

The current of the primary-electron beam 102 does not change with the position of the first principal plane 610e_2, but its width does and therefore its current density does too. As the first principal plane 610e_2 is moved closer to the electron source 101, the width of the primary-electron beam 102 become smaller and the current density therefore increases. Accordingly, as the first principal plane 610m_2 moves from P3 to P1 and then to P2, the width of the primary-electron beam 102 broadens from 102W_P3 to 102W_P1 and then to 102W_P2. If the electrostatic embodiment 610e comprises more electrodes placed within a longer area along the optical axis 610e_1, the current density can be varied more smoothly within a larger range.

FIG. 13A shows one magnetic embodiment 610m of the movable condenser lens 610 in FIG. 10, and shapes of the primary-electron beam 102 when the first principal plane 610m_2 is at the positions P1, P2 and P3 respectively. The movable condenser lens 610m is a compound magnetic lens, which comprises two single magnetic lenses 610m-m1 and 610m-m2 aligned with its optical axis 610m_1. The optical axis 610m_1 is placed coincident with the primary optical axis 600_1. The focusing power and the position of the first principal plane 610m_2 of the embodiment 610m vary with the excitation mode of the single magnetic lenses 610m-m1 and 610m-m2. When the excitation of the single magnetic lens 610m-m2 is set zero, by appropriately setting the excitation of the single magnetic lens 610m-m1, the first principal plane 610m_2 will be at the position P3 within the magnetic-circuit gap thereof and the primary-electron beam 102 can be collimated over there. When the excitation of the single magnetic lens 610m-m1 is set zero, by appropriately setting the excitation of the single magnetic lens 610m-m2, the first principal plane 610m_2 will be at the position P2 within the magnetic-circuit gap thereof and the primary-electron beam 102 can be collimated over there. When the excitations of the single magnetic lenses 610m-m1 and 610m-m2 are not zero, by appropriately setting the excitation ratios thereof, the first principal plane 610m_2 will be at a position (such as P1) between the magnetic-circuit gaps thereof and the primary-electron beam 102 can be collimated over there. Accordingly, as the first principal plane 610m_2 moves from P3 to P1 and then to P2, the width of the primary-electron beam 102 broadens from 102W_P3 to 102W_P1 and then to 102W_P2. If the magnetic embodiment 610m comprises more single magnetic lenses placed within a longer area along the optical axis 610m_1, the current density of the primary-electron beam 102 can be varied more smoothly within a larger range. To reduce the manufacturing cost, the neighboring magnetic lenses can share the magnetic circuit therebetween, as shown in FIG. 13B.

The movable condenser lens 610 can also be an electromagnetic-compound lens which comprises multiple annular electrodes and at least one single magnetic lens, and its first principal plane can be moved by adjusting the excitation mode of the annual electrodes and the single magnetic lens.

Due to the large current of the primary-electron beam 102, it is easily perceived that the interactions of the primary electrons may be very strong if the energies thereof are not high enough. For the primary-electron beam 102 passing through the main opening of the main aperture plate 271, only one part is used as the three beamlets (102_1~102_3), and the other part is not useful. The current of the other part is higher than the total current of the three beamlets, and therefore generates a stronger Coulomb effect which disturbs the motions of the primary electrons of the three beamlets and consequently increases the sizes of the three probe spots. Hence it is better to cut off all or partial portion of the other part as early as possible. There are several ways to do so.

Taking the embodiment 300A in FIG. 3 as an example, one way is to place the beamlet-forming means 321 of the source-conversion unit 320 above the condenser lens 210 and close to the electron source 101. In this case, the main aperture plate 271 can be removed. Accordingly, FIG. 14 shows such an embodiment 700A of the new apparatus. In FIG. 14, the three beamlets 102_1, 102_2 and 102_3 respectively pass through the three beam-limit openings 721_1, 721_2 and 721_3 of the beamlet-forming means 721, and the left part of the primary-electron beam 102 is cut off. The condenser lens 210 collimates the three beamlets into the image-forming mean 222, and the three micro-deflectors 222_1d, 222_2d and 222_3d deflect the three beamlets in the way same as FIG. 3. In this case, each of the off-axis beam-limit openings (such as 721_2) can not be aligned with the corresponding micro-deflector (such as 222_2d) as shown in FIG. 3, and needs to be placed with respect to the influence of the condenser lens 210. The currents of the three beamlets can be changed by varying either the emission (angular intensity) of the electron source 101 or the sizes of the beam-limit openings 721_1, 721_2 and 721_3. The beamlet-forming means 721 can be an electric-conduction plate with multiple through-hole groups, each through-hole group comprises three through-holes, and the radial sizes of three through-holes in one through-hole group are different from those of three through-holes in another through-hole group. Three through-holes in one through-hole group function as the three beam-limit openings (721_1~721_3), and therefore the sizes of the three beam-limit openings can be changed by using different through-hole groups.

Another way is to use one pre-beamlet-forming means above the source-conversion unit. Accordingly, FIG. 15A shows such one embodiment 800A of the new apparatus, wherein one pre-beamlet-forming means 872 with three beamlet-forming apertures 872_1, 872_2 and 872_3 is placed above the condenser Lens 210, below and close to the main aperture plate 271. At first the three beamlet-forming apertures cut the wide primary-electron beam 102 into three beamlets 102_1, 102_2 and 102_3, and then the beam-limit openings 321_1, 321_2 and 321_3 cut off the peripheral electrons of the beamlets 102_1, 102_2 and 102_3 and therefore limit the currents thereof. In this case, the currents of the beamlets 102_1, 102_2 and 102_3 can be changed by varying either the emission of the single electron source or the sizes of the beam-limit openings or using a movable condenser lens as shown in FIG. 10. FIG. 15B shows such another embodiment 900A of the new apparatus, wherein one pre-beamlet-forming means 972 with three beamlet-forming apertures 972_1, 972_2 and 972_3 is placed below the condenser Lens 210. From the reducing Coulomb effect point of view the pre-beamlet-forming means 972 in FIG. 15B is not better than the pre-beamlet-forming means 872 in FIG. 15A, but it is easier implemented for many obvious reasons and especially when a magnetic movable condenser lens is used to change the currents of the beamlets.

So far, all the foregoing methods for improving the performance of the new apparatus are individually described on the basis of the embodiment 300A in FIG. 3. Obviously, some or all of these methods can be used together. FIG. 16 shows such an embodiment 1000A of the new apparatus, which uses one pre-beamlet-forming means 872 shown in FIG. 15A to reduce the Coulomb effect due to the primary-electron beam 102, one movable condenser lens 610 shown in FIG. 10 to vary the currents of the probe spots 102_1s-102_3s, one image-forming means 422 in FIG. 4 to compensate the off-axis aberrations of the probe spots. In another embodiment (not shown here) similar to the embodiment 1000A, the Coulomb effect due to the primary-electron beam 102 is reduced by employing the pre-beamlet-forming means 972 shown in FIG. 15B.

As well known, the landing energies of the plurality of beamlets can be varied by changing either or both of the potential of the emitter in the electron source 101 and the potential of the sample surface 7. However only varying the potential of the sample surface 7 is advantageous because the corresponding adjustment on the source-conversion unit is minor.

In summary, this invention proposes a new multi-beam apparatus which provides both high resolution and high throughput for observing a sample in flexibly varying observing conditions, and therefore can function as a yield management tool to inspect and/or review defects/particles on wafers/masks in semiconductor manufacturing industry. In the new apparatus, one condenser collimates or substantially collimates the primary-electron beam into one source-conversion unit, the source-conversion unit deflects a plurality of beamlets of the primary-electron beam towards the optical axis of one objective lens, and the objective lens focuses the plurality of deflected beamlets onto the sample surface and therefore a plurality of probe spots is formed thereon, wherein the deflection angles of the plurality of deflected beamlets are adjusted to reduce the sizes of the plurality of probe spots. The currents of the plurality of probe spots can be varied within a large range by changing both of the focusing power and the position of the first principal plane of the condenser lens. To further reduce the sizes of the plurality of probe spots, the off-axis aberrations thereof can be compensated by the source-conversion unit and the Coulomb effect due to the primary-electron beam can be weakened by placing the beamlet-forming means of the source conversion unit close to the single electron source or using one pre-beamlet-forming means.

Although the present invention has been explained in relation to its preferred embodiment, it is to be understood that other modifications and variation can be made without departing the spirit and scope of the invention as hereafter claimed.

What is claimed is:

1. A multi-beam apparatus for observing a surface of a sample, comprising:
an electron source;
a condenser lens below said electron source;
a source-conversion unit below said condenser lens;
an objective lens below said source-conversion unit;
a deflection scanning unit below said source-conversion unit;
a sample stage below said objective lens;
a beam separator below said source-conversion unit;
a secondary projection imaging system; and
an electron detection device with a plurality of detection elements,
wherein said electron source, said condenser lens and said objective lens are aligned with a primary optical axis of said apparatus, and said sample stage sustains said sample so that said surface faces to said objective lens,
wherein said source-conversion unit comprises a beamlet-forming means with a plurality of beam-limit openings and an image-forming means with a plurality of electron optics elements,
wherein said electron source generates a primary-electron beam along said primary optical axis, and said primary-electron beam is focused by said condenser lens to become a substantially parallel beam and then incident into said source-conversion unit,
wherein a plurality of beamlets of said primary-electron beam exits from said source-conversion unit, said plurality of beamlets respectively passes through said plurality of beam-limit openings and is deflected by said plurality of electron optics elements towards said primary optical axis, and deflection angles of said plurality of beamlets are different;
wherein said plurality of beamlets is focused by said objective lens onto said surface and forms a plurality of probe spots thereon, said deflection scanning unit deflects said plurality of beamlets to scan said plurality of probe spots respectively over a plurality of scanned regions within an observed area on said surface, and currents of said plurality of probe spots are limited by said plurality of beam-limit openings,
wherein a plurality of secondary electron beams is generated by said plurality of probe spots respectively from said plurality of scanned regions and directed into said secondary projection imaging system by said beam separator, said secondary projection imaging system focuses and keeps said plurality of secondary electron beams to be detected by said plurality of detection elements respectively, and each detection element therefore provides an image signal of one corresponding scanned region,
wherein said deflection angles are individually set to reduce aberrations of said plurality of probe spots respectively.

2. The apparatus according to claim 1, wherein said plurality of electron optics elements is below and aligned with said plurality of beam-limit openings respectively.

3. The apparatus according to claim 2, wherein each of said plurality of electron optics elements is a 4-pole lens.

4. The apparatus according to claim 2, wherein currents of said plurality of probe spots are varied by using said condenser lens to change a current density of said primary-electron beam incident into said source-conversion unit.

5. The apparatus according to claim 4, further comprising a pre-beamlet-forming means with a plurality of beamlet-forming apertures above said source-conversion unit, wherein said plurality of beamlets passes through said plurality of beamlet-forming apertures respectively and most of electrons outside said plurality of beamlets are cut off.

6. The apparatus according to claim 2, wherein said plurality of electron optics elements compensates one or up to all of field curvature, astigmatism and distortion aberrations of said plurality of probe spots to further reduce sizes and distortions thereof.

7. The apparatus according to claim 6, wherein each of said plurality of electron optics elements is an 8-pole lens.

8. The apparatus according to claim 6, wherein each of said plurality of electron optics elements comprises one micro-lens and two 4-pole lenses which are aligned with and placed along an optical axis of said each element, and said two 4-pole lenses have a 45° difference in azimuth.

9. The apparatus according to claim 8, wherein for said each of said plurality of electron optics elements, one of said two 4-pole lenses is on a beamlet exit side and one corresponding beamlet is deflected by said one 4-pole lens.

10. The apparatus according to claim 6, wherein currents of said plurality of probe spots are varied by using said condenser lens to change a current density of said primary-electron beam incident into said source-conversion unit.

11. The apparatus according to claim 10, wherein said condenser lens comprises multiple annular electrodes which are placed at different axial positions along and aligned with said primary optical axis, and voltages thereof can be adjusted to change said current density.

12. The apparatus according to claim 10, wherein said condenser lens comprises at least two single magnetic lenses which are placed at different axial positions along and aligned with said primary optical axis, and excitations thereof can be adjusted to change said current density.

13. The apparatus according to claim 10, wherein said condenser lens comprises multiple annular electrodes and at least one single magnetic lens which are placed at different axial positions along and aligned with said primary optical axis, and voltages of said electrodes and excitations of said at least one single magnetic lens can be adjusted to change said current density.

14. The apparatus according to claim 10, further comprising a pre-beamlet-forming means with a plurality of beamlet-forming apertures above said source-conversion unit, wherein said plurality of beamlets passes through said plurality of beamlet-forming apertures respectively and most of electrons outside said plurality of beamlets are cut off.

15. The apparatus according to claim 9, wherein said condenser lens comprises at least two single magnetic lenses which are placed at different axial positions along and aligned with said primary optical axis, and excitations thereof can be adjusted to change a current density of said primary-electron beam incident into said source-conversion unit.

16. The apparatus according to claim 15, wherein landing energies of said plurality of beamlets on said surface are varied by changing a potential thereof.

17. The apparatus according to claim 16, further comprising a pre-beamlet-forming means with a plurality of beamlet-forming apertures above said source-conversion unit, wherein said plurality of beamlets passes through said plurality of beamlet-forming apertures respectively and most of electrons outside said plurality of beamlets are cut off.

18. A multi-beam apparatus for observing a surface of a sample, comprising:
an electron source;
a condenser lens below said electron source;
a source-conversion unit below said condenser lens;
an objective lens below said source-conversion unit;
a deflection scanning unit below said source-conversion unit;
a sample stage below said objective lens;
a beam separator below said source-conversion unit;
a secondary projection imaging system; and
an electron detection device with a plurality of detection elements,
wherein said electron source, said condenser lens and said objective
lens are aligned with a primary optical axis of said apparatus, and said sample
stage sustains said sample so that said surface faces to said objective lens,
wherein said source-conversion unit comprises a beamlet-forming means with a plurality of beam-limit openings and an image-forming means with a plurality of electron optics elements,
wherein said electron source generates a primary-electron beam along said primary optical axis, said condenser lens focuses said primary-electron beam and said primary-electron beam then is incident into said source-conversion unit with a convergent or divergent angle,
wherein a plurality of beamlets of said primary-electron beam exits from said source-conversion unit, said plurality of beamlets respectively passes through said plurality of beam-limit openings and is deflected by said plurality of electron optics elements towards said primary optical axis,
wherein said plurality of beamlets is focused by said objective lens onto said surface and forms a plurality of probe spots thereon, deflection angles of said plurality of beamlets are individually set to reduce aberrations of said plurality of probe spots respectively, said deflection scanning unit deflects said plurality of beamlets to scan said plurality of probe spots respectively over a plurality of scanned regions within an observed area on said surface, and currents of said plurality of probe spots are limited by said plurality of beam-limit openings,
wherein a plurality of secondary electron beams is generated by said plurality of probe spots respectively from said plurality of scanned regions and directed into said secondary projection imaging system by said beam separator, said secondary projection imaging system focuses and keeps said plurality of secondary electron beams to be detected by said plurality of detection elements respectively, and each detection element therefore provides an image signal of one corresponding scanned region.

19. The apparatus according to claim 18, wherein said plurality of electron optics elements compensates one or up to all of field curvature, astigmatism and distortion aberrations of said plurality of probe spots to further reduce sizes and distortions thereof.

20. The apparatus according to claim 18, wherein currents of said plurality of probe spots are varied by using said condenser lens to adjust a current density of said primary-electron beam incident into said source-conversion unit.

21. The apparatus according to claim 20, wherein said plurality of electron optics elements compensates one or up to all of field curvature, astigmatism and distortion aberrations of said plurality of probe spots to further reduce sizes and distortions thereof.

22. The apparatus according to claim 21, wherein said plurality of electron optics elements is below said plurality of beam-limit openings.

23. The apparatus according to claim 22, further comprising a pre-beamlet-bending means with a plurality of pre-bending micro-deflectors respectively above said plurality of beam-limit openings.

24. The apparatus according to claim 23, wherein said plurality of pre-bending micro-deflectors deflects said plurality of beamlets to be perpendicularly incident into said plurality of beam-limit openings.

25. The apparatus according to claim 24, further comprising a pre-beamlet-forming means with a plurality of beamlet-forming apertures above said source-conversion unit, wherein said plurality of beamlets passes through said plurality of beamlet-forming apertures respectively and most of electrons outside said plurality of beamlets are cut off.

26. A multi-beam apparatus for observing a surface of a sample, comprising:
an electron source;
a beamlet-forming plate providing a plurality of beam-limit openings below said electron source;
a condenser lens below said beamlet-forming plate;
a plurality of electron optics elements below said condenser lens;
an objective lens below said plurality of electron optics elements;
a deflection scanning unit below said plurality of electron optics elements;
a sample stage below said objective lens;
a beam separator below said plurality of electron optics elements;
a secondary projection imaging system; and
an electron detection device with a plurality of detection elements,
wherein said electron source, said condenser lens and said objective lens are aligned with a primary optical axis of said apparatus, and said sample stage sustains said sample so that said surface faces to said objective lens,
wherein said electron source generates a primary-electron beam along said primary optical axis, said beamlet-forming plate trims said primary-electron beam into a plurality of beamlets respectively passing through a plurality of through-holes of a first group therein, and said plurality of through-holes functions as a plurality of beam-limit openings of said apparatus,
wherein said condenser lens focuses said plurality of beamlets to be deflected by said plurality of electron optics elements respectively towards said primary optical axis,
wherein said plurality of beamlets is focused by said objective lens onto said surface and forms a plurality of probe spots thereon, deflection angles of said plurality of beamlets are individually set to reduce aberrations of said plurality of probe spots respectively, said deflection scanning unit deflects said plurality of beamlets to scan said plurality of probe spots respectively over a plurality of scanned regions within an observed area on said surface, and currents of said plurality of probe spots are limited by said plurality of beam-limit openings,
wherein a plurality of secondary electron beams is generated by said plurality of probe spots respectively from said plurality of scanned regions and directed into said secondary projection imaging system by said beam separator, said secondary projection imaging system focuses and keeps said plurality of secondary electron beams to be detected by said plurality of detection elements respectively, and each detection element therefore provides an image signal of one corresponding scanned region.

27. The apparatus according to claim 26, wherein said plurality of beamlets is perpendicularly incident into said plurality of electron optics elements.

28. The apparatus according to claim 27, wherein said plurality of electron optics elements compensates one or up to all of field curvature, astigmatism and distortion aberrations of said plurality of probe spots to further reduce sizes and distortions thereof.

29. The apparatus according to claim 28, wherein currents of said plurality of beamlets are varied by adjusting an angular intensity of said electron source.

30. The apparatus according to claim 28, wherein currents of said plurality of beamlets are varied by changing radial sizes of said plurality of beam-limit openings.

31. The apparatus according to claim 30, wherein said radial sizes are changed by moving said beamlet-forming plate to locate a plurality of through-holes of a second group therein as said plurality of beam-limit openings.

32. A method to form a plurality of probe spots in a SEM, comprising steps of:
generating a primary-electron beam by an electron source;
collimating or substantially collimating said primary-electron beam by a condenser lens;
trimming said collimated primary-electron beam into a plurality of beamlets by a first plate with first through-holes;
deflecting said plurality of beamlets towards an optical axis of an objective lens with different deflection angles by a plurality of electron optics elements;
focusing said plurality of deflected beamlets onto a being-observed surface of a sample by said objective lens, wherein said plurality of deflected and focused beamlets forms said plurality of probe spots; and
individually setting said deflection angles to reduce aberrations of said plurality of probe spots respectively.

33. The method according to claim 32, further comprising a step of compensating one or up to all of field curvature, astigmatism and distortion aberrations of said plurality of probe spots by said plurality of electron optics elements.

34. The method according to 33, further comprising a step of varying a current density of said collimated primary-electron beam by moving a first principal plane of said condenser lens.

35. The method according to 34, further comprising a step of cutting off most of electrons outside said plurality of beamlets by a second plate with second through-holes before said trimming step.

36. A method to form a plurality of probe spots in a SEM, comprising steps of:
generating a primary-electron beam by an electron source;
trimming said primary-electron beam into a plurality of beamlets by a plate with a plurality of through-holes;
focusing said plurality of beamlets by a condenser lens;
deflecting said plurality of beamlets towards an optical axis of an objective lens by a plurality of electron optics elements;

focusing said plurality of deflected beamlets onto a being-observed surface of a sample by said objective lens, wherein said plurality of deflected and focused beamlets forms said plurality of probe spots; and setting deflection angles of said plurality of deflected beamlets individually to reduce aberrations of said plurality of probe spots respectively.

37. The method according to claim 36, further comprising a step of compensating one or up to all of field curvature, astigmatism and distortion aberrations of said plurality of probe spots by said plurality of electron optics elements.

38. The method according to claim 37, further comprising a step of varying currents of said plurality of beamlets by changing an angular intensity of said electron source.

39. The method according to claim 37, further comprising a step of changing currents of said plurality of beamlets by using another plurality of through-holes of said plate in said trimming step.

40. A multi-beam apparatus, comprising:
a device for providing multiple sources, comprising:
a charged-particle source for providing a primary beam along an optical axis of the device;
a condenser lens for substantially collimating the primary beam; and
a source-conversion unit for imaging a plurality of virtual images of the charged-particle source with a plurality of beamlets of the collimated primary beam, wherein the plurality of virtual images becomes the multiple sources which emit the plurality of beamlets respectively;
an objective lens for projecting the plurality of virtual images on a sample surface such that a plurality of probe spots is formed thereon;
a deflection scanning unit for scanning the plurality of probe spots on the sample surface; and
a detection device for receiving a plurality of signal particle beams generated from the sample surface due to plurality of probe spots,
wherein the source-conversion unit comprises a plurality of electron optics elements for individually deflecting at least some of the plurality of beamlets to reduce aberrations of at least some of the plurality of probe spots respectively.

41. The multi-beam apparatus according to claim 40, wherein the device further comprises a beam-limit unit including a plurality of beam-limit opening for varying currents of the plurality of beamlets.

42. The multi-beam apparatus according to claim 41, wherein the device further comprises an aperture plate for suppressing Coulomb effect due to the primary beam.

43. The multi-beam apparatus according to claim 40, further comprising the plurality of electron optics elements for individually compensating the aberrations of at least some of the plurality of probe spots.

44. The multi-beam apparatus according to claim 43, wherein the objective lens is a single objective lens.

* * * * *